United States Patent
Naya et al.

(10) Patent No.: US 6,850,854 B2
(45) Date of Patent: Feb. 1, 2005

(54) SEMICONDUCTOR PRODUCTION SYSTEM

(75) Inventors: Hidemitsu Naya, Hitachi (JP); Rikio Tomiyoshi, Mito (JP); Shigeo Moriyama, Tama (JP); Mutsumi Kikuchi, Hitachi (JP); Kotaro Shimamura, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/444,981

(22) Filed: May 27, 2003

(65) Prior Publication Data

US 2003/0220754 A1 Nov. 27, 2003

Related U.S. Application Data

(63) Continuation of application No. 09/942,425, filed on Aug. 29, 2001, now Pat. No. 6,591,207.

(30) Foreign Application Priority Data

Feb. 23, 2001 (JP) ........................................ 2001-048932

(51) Int. Cl.[7] .............................................. G06F 19/00
(52) U.S. Cl. .......................................... 702/81; 702/83
(58) Field of Search ............................... 118/100, 300, 118/320; 355/53; 438/14, 15, 16, 17, 78; 700/95, 96, 108, 109, 115; 702/81, 83, 182, 127

(56) References Cited

U.S. PATENT DOCUMENTS

| | | | |
|---|---|---|---|
| 5,233,191 A | 8/1993 | Noguchi et al. ............ 250/306 |
| 5,867,389 A | 2/1999 | Hamada et al. | |
| 5,936,710 A | 8/1999 | Itoh et al. ...................... 355/53 |
| 6,185,474 B1 | 2/2001 | Nakamura et al. .......... 700/121 |
| 6,320,646 B1 | 11/2001 | Mouri .......................... 355/53 |
| 6,445,441 B1 | 9/2002 | Mouri .......................... 355/53 |
| 6,487,472 B1 | 11/2002 | Song et al. .................. 700/121 |
| 6,514,345 B1 | 2/2003 | Nagata et al. .............. 118/697 |
| 6,638,672 B2 * | 10/2003 | Deguchi ....................... 430/30 |
| 6,650,409 B1 * | 11/2003 | Noguchi et al. ......... 356/237.3 |
| 6,657,703 B2 * | 12/2003 | Kurosawa ..................... 355/55 |
| 6,704,093 B2 * | 3/2004 | Kurosawa ..................... 355/53 |

FOREIGN PATENT DOCUMENTS

| | | |
|---|---|---|
| JP | 09-953441 | 6/1997 |
| JP | 9-274 582 | 10/1997 |
| JP | 2000-164667 | 6/2000 |
| KR | 1998-79878 | 11/1998 |
| WO | WO 00/17769 | 3/2000 |
| WO | WO 00/18049 | 3/2000 |
| WO | WO 00/29954 | 5/2000 |

OTHER PUBLICATIONS

Li, C; Milor, L; Ouyang, C; Maly, W; Yeng–Kaung, P;"Analysis of the Impact of Proximity Correction Algorithms on Circuit Performance"; IEEE Transactions on Seniconductor Manufacturing; vol. 12, Issue 3;1999; pp 313–322.*

Molero, X; Silla, F; Santonja, V; Duato, J;"On the Effect of Link Failures in Fibre Channel Storage Area Networks"; Proceeding of International Symposium on Parallel Architectures, Algorithms and Networks; Dec. 7–9, 2000; pp 102–111.*

Phillips, B.: Have Storage Area Networks Come of Age?; Computer; vol. 31, Issue 7, Jul. 1998, pp. 10–12.

* cited by examiner

*Primary Examiner*—John Barlow
*Assistant Examiner*—Douglas N Washburn
(74) *Attorney, Agent, or Firm*—Kenyon & Kenyon

(57) ABSTRACT

A semiconductor production system has a semiconductor manufacturing apparatus having an exposure unit, a control unit for controlling the exposure unit and a storage device; a semiconductor inspection apparatus having an observation unit, a control unit for controlling the observation unit and a storage device; and a storage device commonly used by the semiconductor manufacturing apparatus and the semiconductor inspection apparatus. The manufacturing apparatus, the inspection apparatus and the commonly used storage device are interconnected via a storage area network. With the semiconductor manufacturing apparatus and the storage device linked together via the storage area network, a large volume of image data or design data can be communicated at high speed, thus improving the system throughput.

9 Claims, 32 Drawing Sheets

FIG. 18

| ALLOWABLE RANGE | MEASURED VALUE | PERFORMANCE VALUE |
|---|---|---|
| | | |
| | | |
| | | |
| | | |
| | | |
| | | |
| | | |
| | | |
| | | |
| | | |

400 CORRELATION TABLE
410 — ALLOWABLE RANGE
420 — MEASURED VALUE
430 — PERFORMANCE VALUE

SEMICONDUCTOR PRODUCTION SYSTEM

This is a continuation of application Ser. No. 09/942,425, filed Aug. 29, 2001 now U.S. Pat. No. 6,591,207.

BACKGROUND OF THE INVENTION

The present invention relates to a semiconductor production system and more particularly to a semiconductor production system linking a semiconductor manufacturing apparatus, an inspection apparatus and a storage device by using a storage area network.

A commonly used communication means for interconnecting apparatus is a LAN (local area network) described, for example, in Japanese Patent Unexamined Publication No. 2000-164667. Another system is also known which, as disclosed in Japanese Patent Unexamined Publication No. 9-153441 (corresponding to U.S. Pat. No. 5,867,389), divides a LAN into a plurality of segments and installs a processing station between the divided segments to copy data.

The storage area network is an independent network which is constructed of only storages, devices for storing data, by separating the storages from a server. Examples of such storage area networks include those networks based on such links as a fiber channel (one of serial interface standards) described in WO 00/18049 and WO 00/17769 and an optical fiber described in WO 00/2954. The storage area network is a general term for networks that link storage devices independently of the kind of communication devices used. A link of storage devices through a serial bus as defined in IEEE1394 and a link of storage devices through a switched bus as defined by InfiniBand (registered trade name) are storage area networks. However, Ethernet which handles storage protocol, such as iSCSI (registered trade name) and SEP (SCSI Encapsulation Protocol), is the storage area networks.

SUMMARY OF THE INVENTION

An object of the present invention is to provide a semiconductor production system capable of transferring at high speed and storing a large volume of image data or design data.

Another object of the present invention is provide a semiconductor production system capable of linking various information in the semiconductor production system via network to improve system throughput.

In the conventional technologies described above, because two kinds of data, namely a large volume of CAD data representing design information on semiconductors and semiconductor masks and message data representing control commands for controlling and linking a variety of devices are transferred on the same network without considering the kind of data flowing through the network, traffic inevitably increases, degrading the performance of the network, which in turn adversely affects the overall performance of the system. That is, the conventional networks have a problem that the throughput of the networks changes according to the frequency of issuing the control command, the frequency of generating a response to the command and the transmission/reception of a large volume of data such as image data, thus degrading the overall performance of the apparatus. As the advance of the micro-fabrication technology in particular drastically increases the volumes of the image data obtained as a result of inspection and of the CAD data representing the design information on semiconductors and masks, the band of the network is occupied by simply communicating these data. This adversely affects the transmission and reception of message data.

There is a technique that divides a LAN into a plurality of segments and installs processing stations between the segments to perform copying of data to alleviate the traffic. In this case, however, because the processing stations copy data between the segments, the processing stations themselves become a bottleneck of the overall performance of the system. For example, if the inspection apparatus and manufacturing apparatus are connected together via network, data must be copied via network in order to transfer data between these apparatus, thus crowding the network and lowering the throughput of the system as a whole. Further, it is also necessary to copy data between storage devices connected to individual segments and this makes the consistency management of copied data complicated.

The present invention has been accomplished in light of the above-described problems.

To solve the problems above, the present invention adopts the following means.

A semiconductor production system comprises: a semiconductor manufacturing apparatus having an exposure unit, a control unit for controlling the exposure unit and a storage device; a semiconductor inspection apparatus having an observation unit, a control unit for controlling the observation unit and a storage device; and a storage device commonly used by the semiconductor manufacturing apparatus and the semiconductor inspection apparatus; wherein the semiconductor manufacturing apparatus, the semiconductor inspection apparatus and the commonly used storage device are linked together via a storage area network. The semiconductor manufacturing apparatus can be used as an apparatus for making masks for fabricating semiconductors.

As described above, with this invention because the semiconductor manufacturing apparatus or storage devices are linked together via the storage area network, a large volume of image data or design data can be transferred at high speed, improving the system throughput.

BRIEF DESCRIPTION OF THE DRAWINGS

FIG. 18 is a diagram showing an example table which records a correlation between an allowable range, an inspection result and a performance of a final product in the inspection apparatus.

DESCRIPTION OF THE EMBODIMENTS

Figure 1:
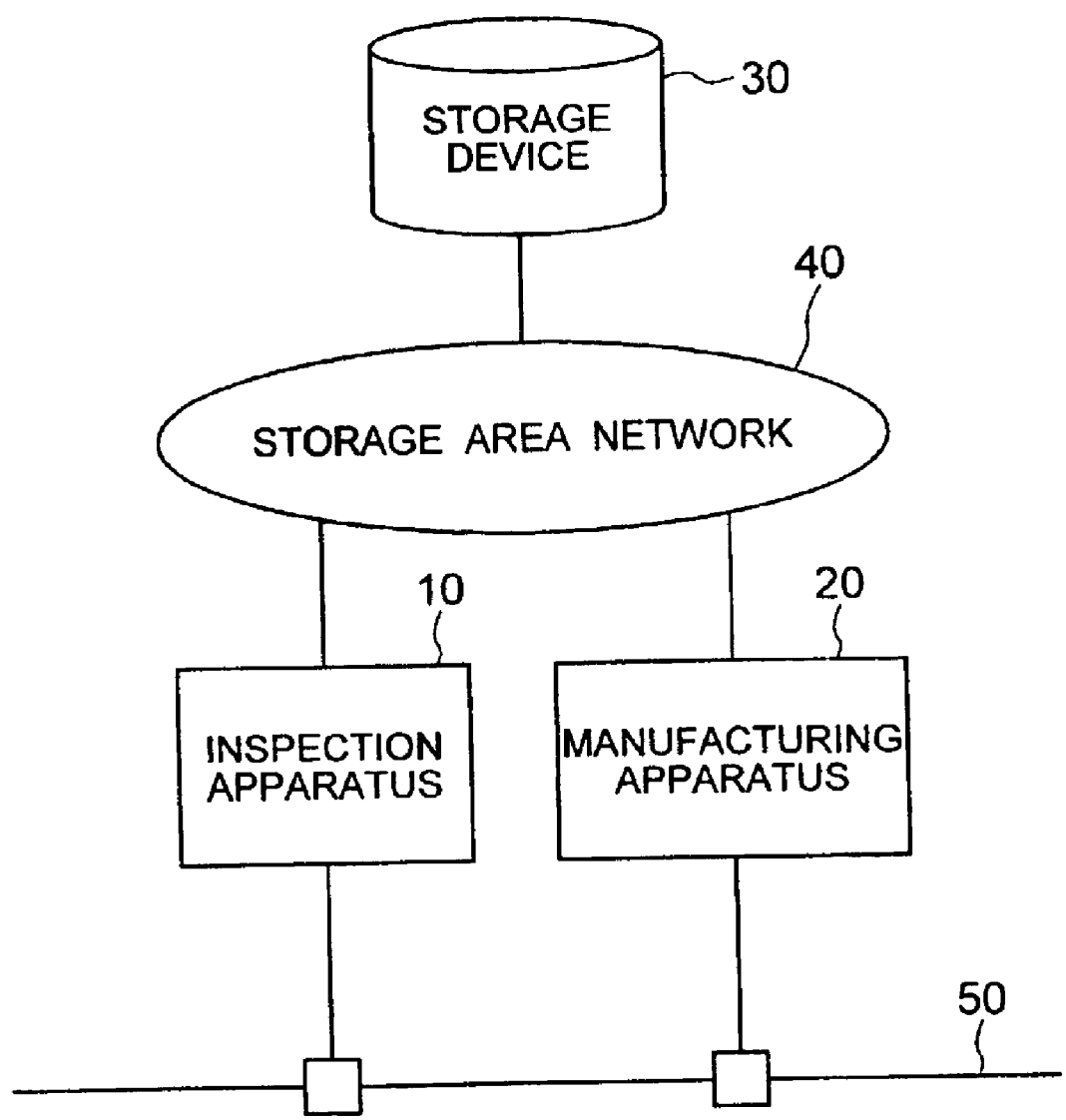
FIG. 1 is a block diagram showing a configuration of a semiconductor production system as one embodiment of the-invention.

Embodiments of the present invention will be described by referring to FIG. 1 to FIG. 32. FIG. 1 is a block diagram showing a semiconductor production system as one embodiment of-the present invention.

As shown in the figure, a storage area network 40 interconnects a semiconductor inspection apparatus 10, a semiconductor manufacturing apparatus 20 and a storage device 30. The semiconductor inspection apparatus 10 and the semiconductor manufacturing apparatus 20 can also be interconnected via a general network 50. In this embodiment, the provision of the storage area network 40 achieves a large-capacity data communication between the semiconductor inspection apparatus 10 and the semiconductor manufacturing apparatus 20 without affecting the general network 50. Because the storage device 30 is shared by the semiconductor inspection apparatus 10 and the semiconductor manufacturing apparatus 20, data does not have to be copied between the apparatus, thus improving the overall performance of the system and simplifying the data management. It is noted that the manufacturing apparatus 20 can be used not only for making semiconductors but also for making semiconductor masks and that the inspection apparatus 10 can be used not only for inspecting semiconductors but also for inspecting semiconductor masks. For the sake of simplicity, these apparatus will be explained as a semiconductor manufacturing apparatus and as a semiconductor inspection apparatus in the following description.

Figure 2:
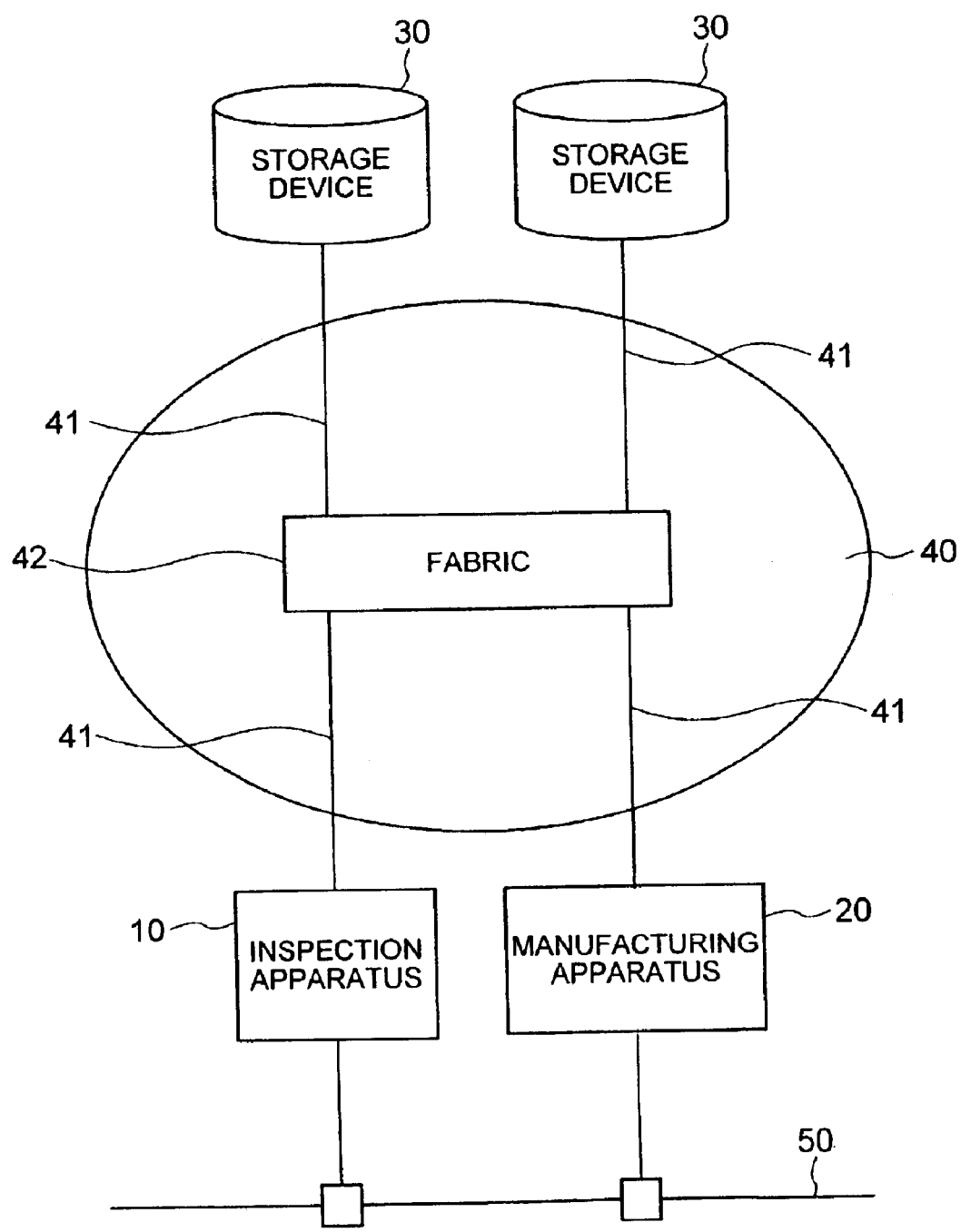
FIG. 2 is a block diagram showing another configuration of the semiconductor production system.

FIG. 2 is a block diagram illustrating another configuration of the semiconductor production system. As shown in the figure, the storage area network 40 interconnects a semiconductor inspection apparatus 10, a semiconductor manufacturing apparatus 20 and a plurality of storage devices 30. The storage area network 40 employs fiber channels 41 as communication devices and interconnects the fiber channels with a fabric 42. The semiconductor inspection apparatus 10 and the semiconductor manufacturing apparatus 20 are linked together via the general network 50.

In the fabric 42 there are switches and a hub, both of which support a hot plug. This allows additional storage devices 30 to be connected dynamically to the storage area network 40 for extension. Because the fabric 42 allows a cascade connection, a further expansion is possible.

By connecting the fabrics using fiber channels, it is possible to arbitrarily select installation locations of the semiconductor inspection apparatus 10, the semiconductor manufacturing apparatus 20 and the storage devices 30. For example, the semiconductor inspection apparatus 10 and the semiconductor manufacturing apparatus 20 may be installed at a manufacturing site and the storage device 30 at an office or data center. With this arrangement, if the manufacturing site is hit by a natural disaster, because all the information associated with the semiconductor inspection apparatus 10 and the semiconductor manufacturing apparatus 20 installed at the manufacturing site is stored in the storage device 30, the recovery from damages will be easy. The configuration using switches in the fabric 42 is identical to those using the InfiniBand for the communication device. Hence, where there is no need for a long-distance communication through the fiber channels 41, the use of the InfiniBand can realize a compact system of the identical configuration.

Figure 3:
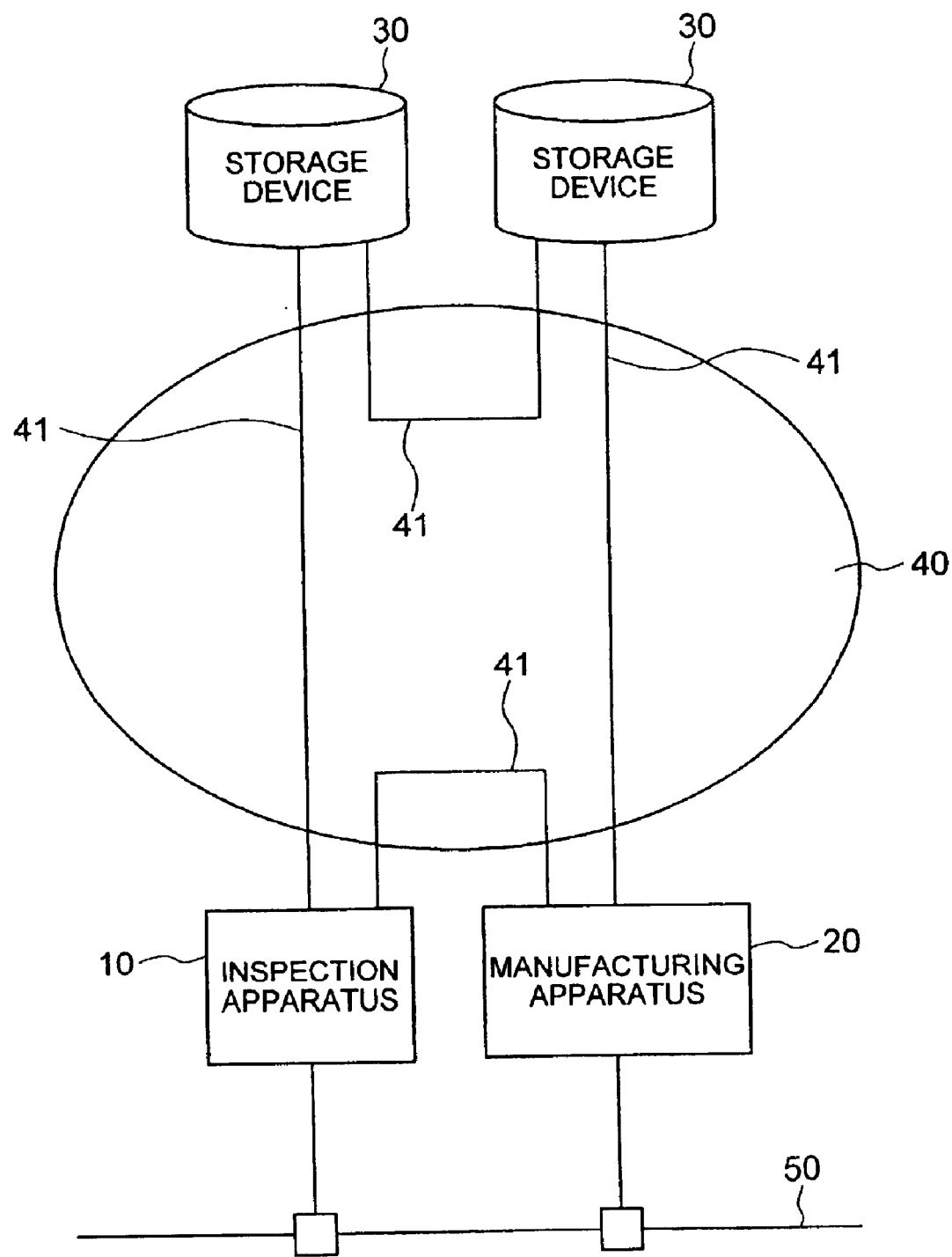
FIG. 3 is a block diagram showing still another configuration of the semiconductor production system.

FIG. 3 is a block diagram showing still another configuration of the semiconductor production system. As shown in the figure, the storage area network 40 interconnects a semiconductor inspection apparatus 10, a semiconductor manufacturing apparatus 20 and a plurality of storage devices 30. The storage area network 40 adopts fiber channels 41 as the communication device connecting the individual apparatus in loop. The semiconductor inspection apparatus 10 and the semiconductor manufacturing apparatus 20 are interconnected through the general network 50. This loop configuration does not require facilities such as fabrics but realizes a simple system that can be built only by connecting fiber optics. This configuration facilitates maintenance and can also achieve a system with duplicated loops easily.

Figure 4:
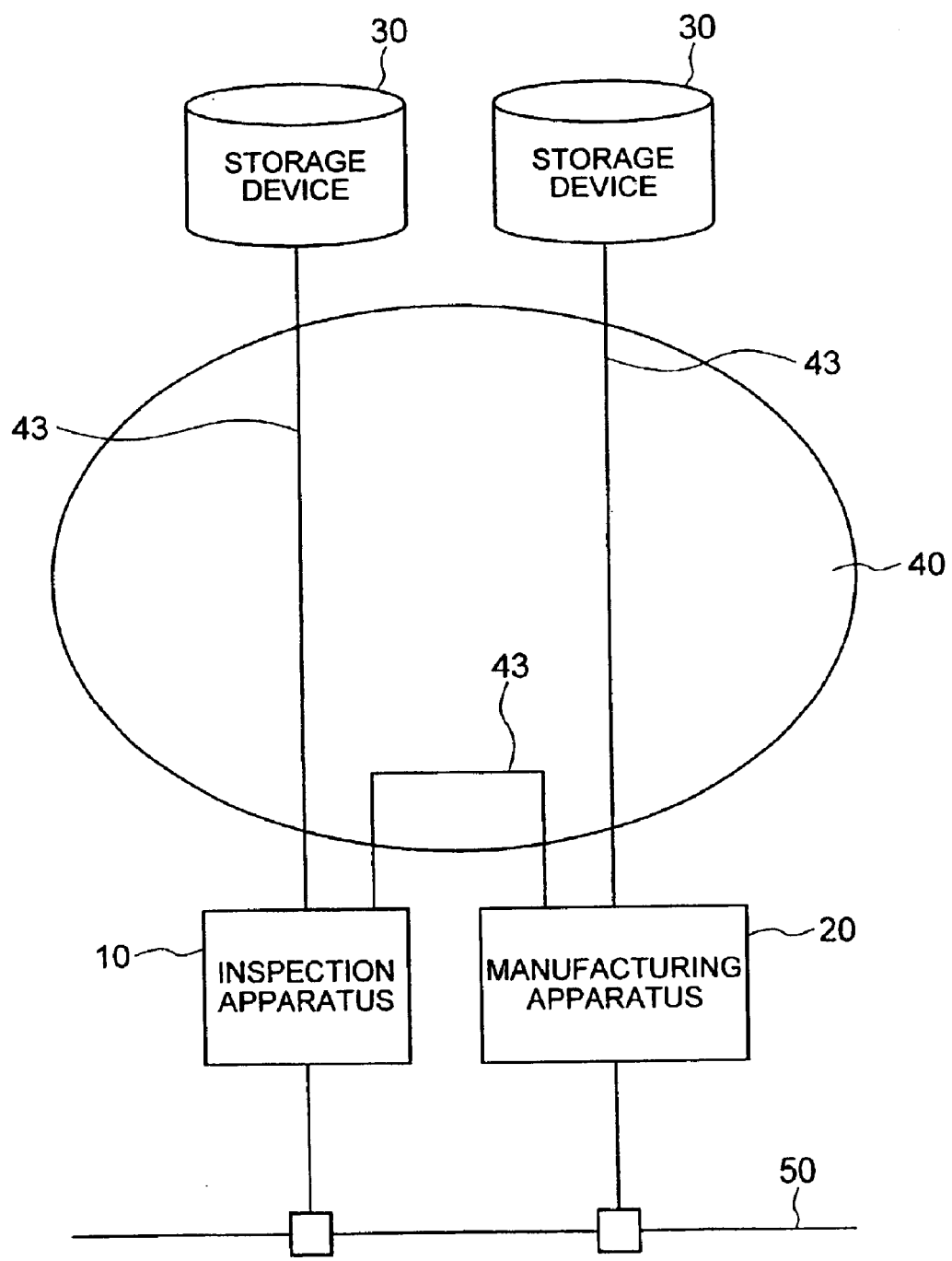
FIG. 4 is a block diagram showing a further configuration of the semiconductor production system.

FIG. 4 is a block diagram showing a further configuration of the semiconductor production system. As shown in the figure, the storage area network 40 interconnects a semiconductor inspection apparatus 10, a semiconductor manufacturing apparatus 20 and a plurality of storage devices 30. The storage area network 40 connects them to the communication device in a tree topology according to the IEEE 1394-43. In this configuration, the inspection apparatus 10 or the manufacturing apparatus 20 is taken as a root of the tree. The semiconductor inspection apparatus 10 and the semiconductor manufacturing apparatus 20 are connected together via the general network 50. The IEEE 1394 supports the hot plug, so the storage devices can be dynamically added to the storage area network for expansion.

Figure 5:
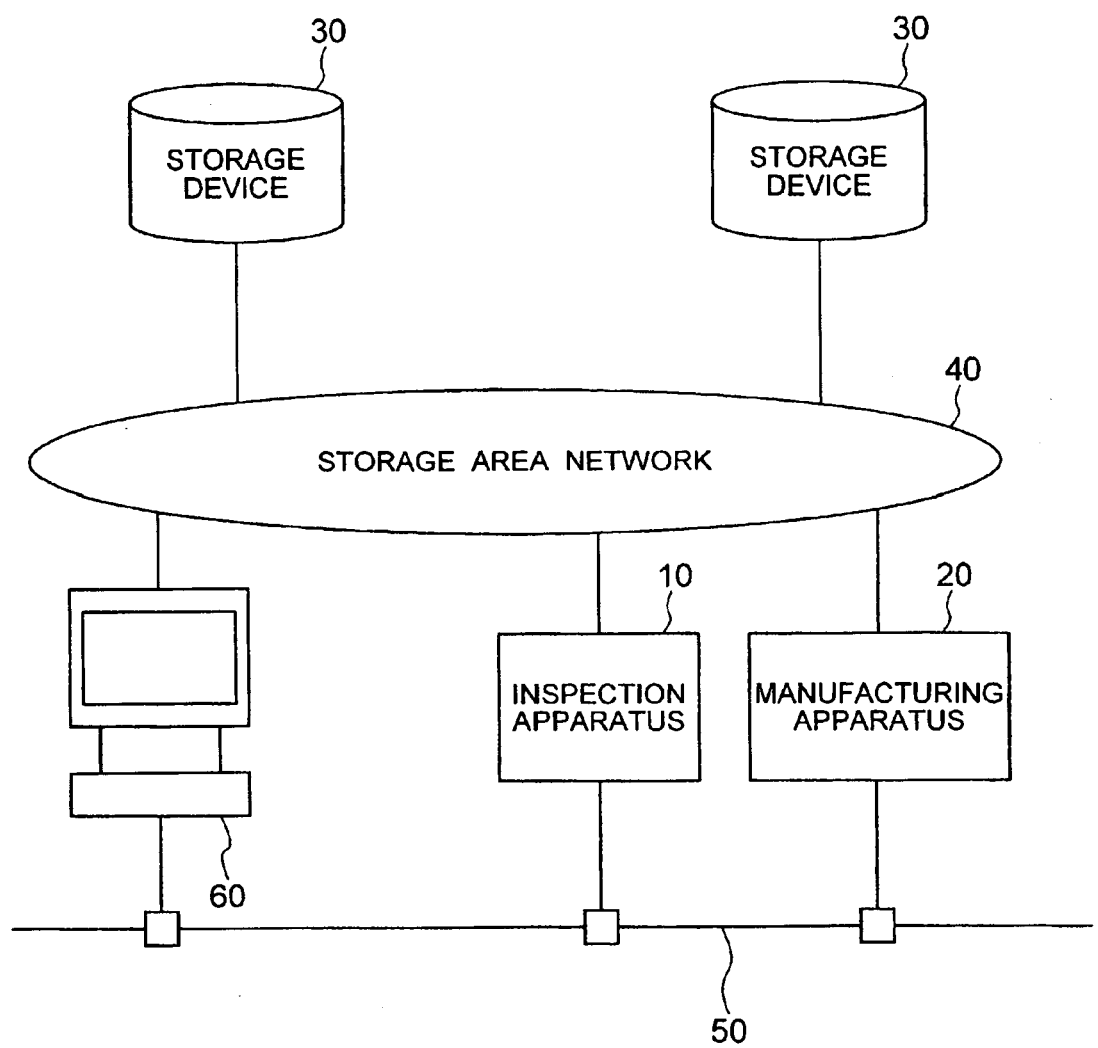
FIG. 5 is a block diagram showing a further configuration of the semiconductor production system.

FIG. 5 is a block diagram showing a further configuration of the semiconductor production system. As shown in the figure, the storage area network 40 interconnects a semiconductor inspection apparatus 10, a semiconductor manufacturing apparatus 20, a plurality of storage devices 30 and a computer 60. The semiconductor inspection apparatus 10, the semiconductor manufacturing apparatus 20 and the computer 60 are linked together via the general network 50. In this embodiment, the provision of the storage area network 40 realizes a large-capacity data communication between the semiconductor inspection apparatus 10, the semiconductor manufacturing apparatus 20 and the computer 60 without affecting the general network 50. The storage device storing data produced in an upstream process such as logic design and the storage device storing data produced in an inspection and manufacturing process have conventionally been separated, so that transfer of information between the two processes is difficult to achieve. With this embodiment, however, there is no need to copy data since the storage devices 30 are shared. This improves the overall performance of the system and simplifies the data management. Further, if a storage area network 40 is selected which can perform a long-distance communication, the installation locations of the semiconductor inspection apparatus 10, the semiconductor manufacturing apparatus 20 and the computer 60 can be set with flexibility.

Figure 6:
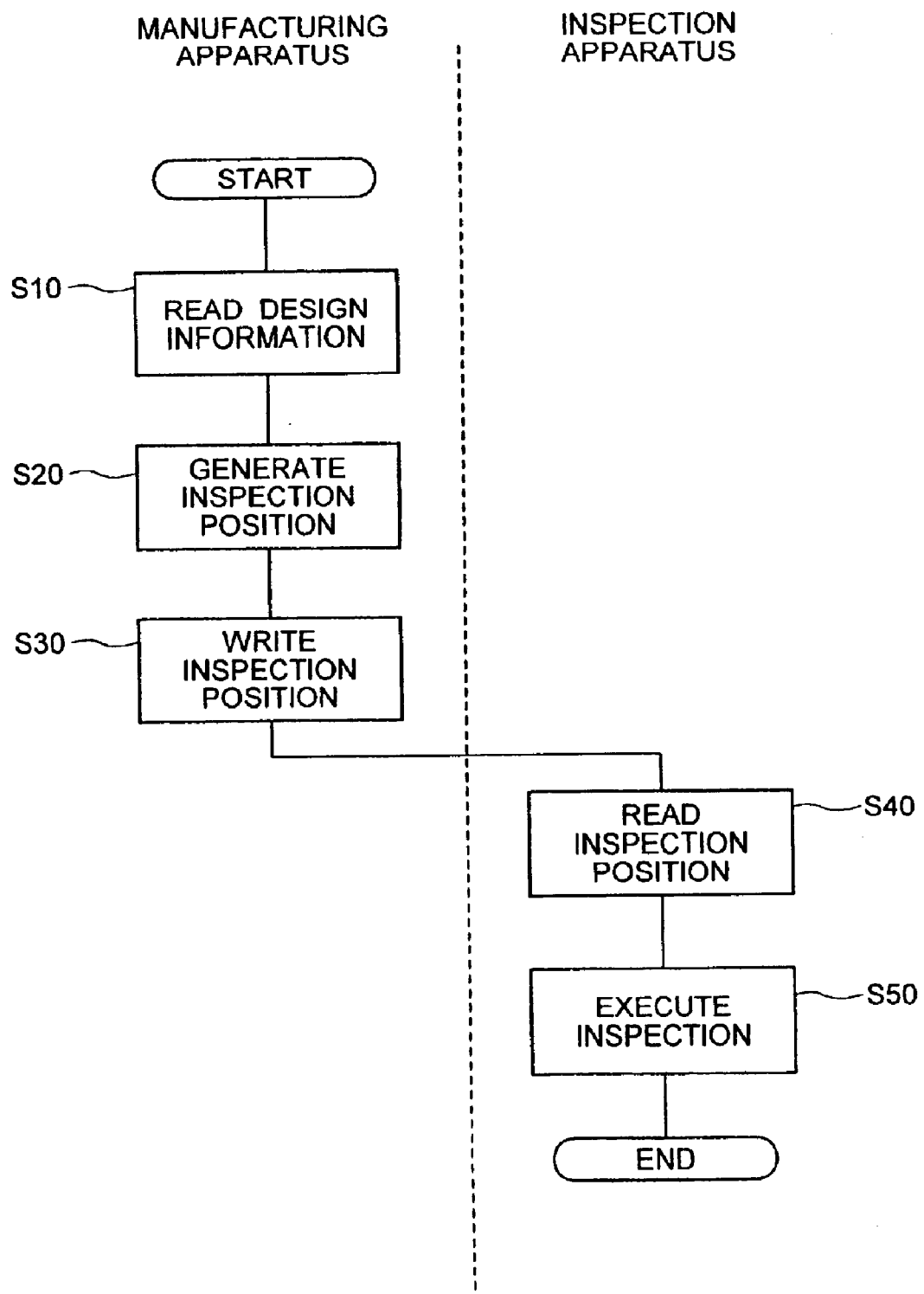
FIG. 6 is a diagram showing a sequence of operations by which a semiconductor manufacturing apparatus generates an inspection position and a semiconductor inspection apparatus executes an inspection.
Figure 7:
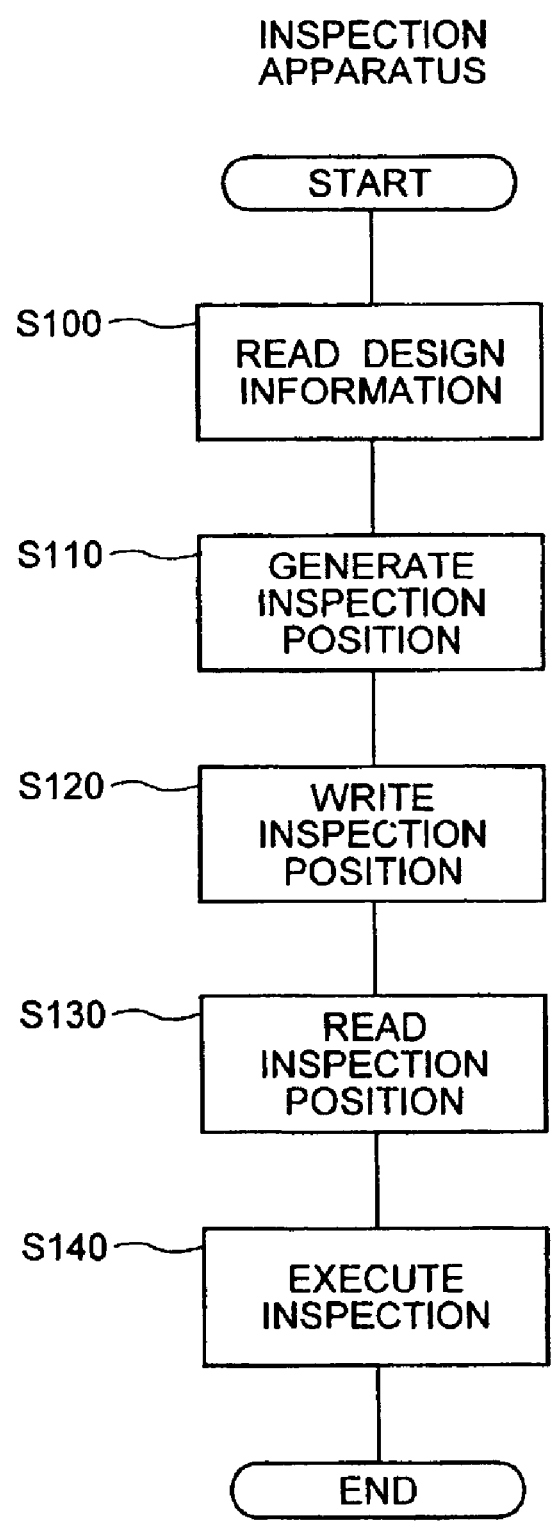
FIG. 7 is a diagram showing a sequence by which the semiconductor inspection apparatus generates an inspection position and executes an inspection.
Figure 8:
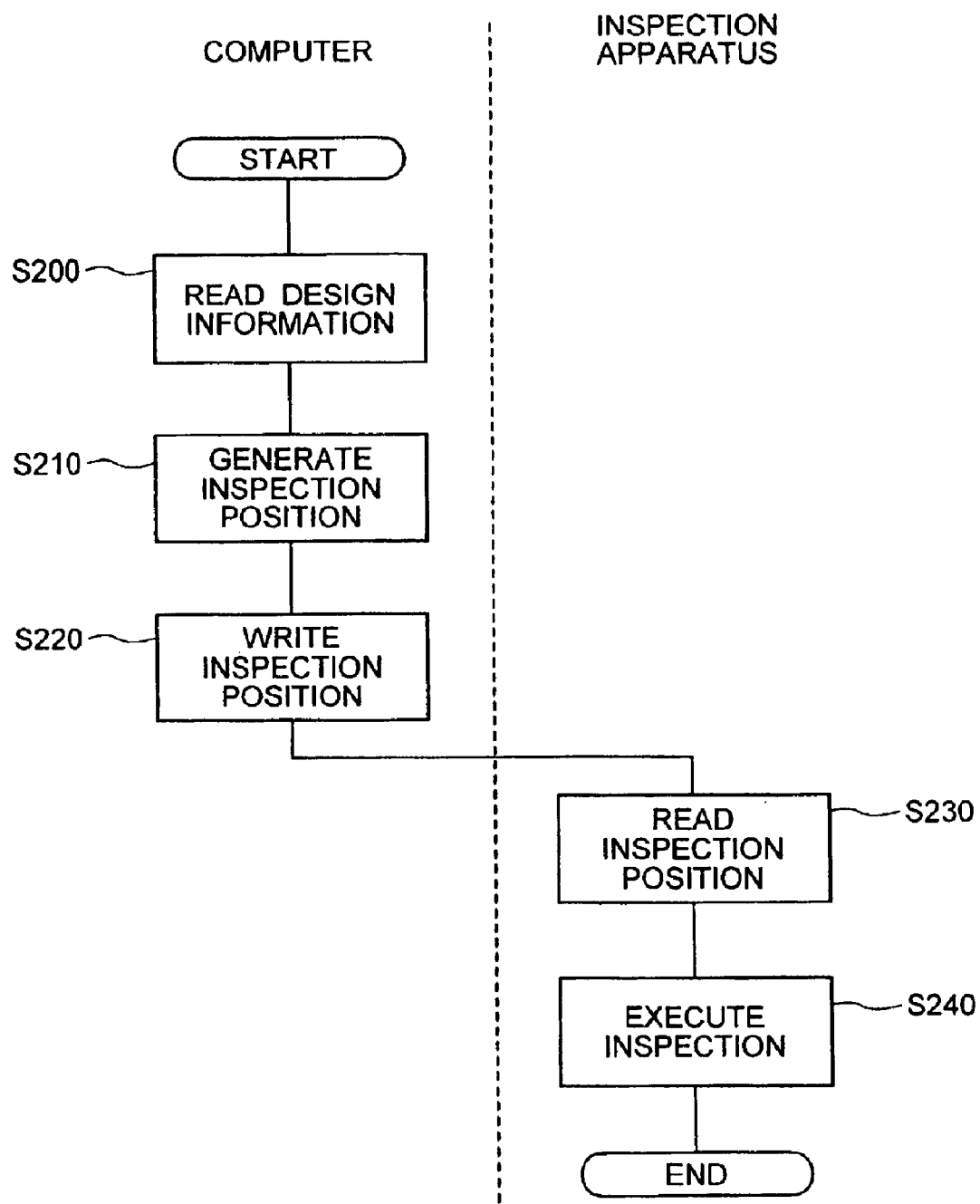
FIG. 8 is a diagram showing a sequence by which a computer connected to a storage area network generates an inspection position and the semiconductor inspection apparatus executes an inspection.

FIG. 6 to FIG. 8 are diagrams showing inspection processing. FIG. 6 illustrates a sequence of operations by which the semiconductor manufacturing apparatus generates an inspection position and the semiconductor inspection apparatus executes an inspection accordingly. The manufacturing apparatus 20 first reads design information from the storage device 30 (S10). Next, based on the design information read out, the manufacturing apparatus generates an inspection position or inspection area (S20). Then it writes the generated inspection position into the storage device 30 (S30). The written information serves as a log indicating the execution of the processing. Next, the inspection apparatus 10 reads the inspection position from the storage device 30 (S40) and executes an inspection according to the inspection position retrieved (S50). By specifying the inspection position from a device external to the inspection apparatus 10 in this way, the load of the inspection apparatus can be alleviated to improve the performance of the inspection apparatus.

FIG. 7 illustrates a sequence of operations by which the semiconductor inspection apparatus generates an inspection position and executes an inspection accordingly. First, the inspection apparatus 10 reads design information from the storage device 30 (S100) and, based on the design information read out, generates an inspection position or inspection area (Silo). Then, it writes the generated inspection position into the storage device 30 (S120). The written information serves as a log indicating the execution of the processing. Next, the inspection apparatus reads the inspection position from the storage device 30 (S130) and executes an inspection according to the inspection position retrieved (S140). By generating the inspection position internally of the inspection apparatus 10 in this manner, the load of other than the inspection apparatus can be alleviated.

FIG. 8 illustrates a sequence of operations by which the computer connected to the storage area network generates an inspection position and the semiconductor inspection apparatus executes an inspection accordingly. First, the computer 60 reads design information from the storage device 30 (S200). Then, based on the design information read out, the computer 60 generates an inspection position or inspection area (S210). Next, it writes the generated inspection position into the storage device 30 (S220). The written information serves as a log indicating the execution of the processing. Next, the inspection apparatus 10 retrieves the inspection position from the storage device 30 (S230) and executes an inspection according to the retrieved position (S240). Specifying the inspection position from a device external to the inspection apparatus 10 in this manner can reduce the load of the inspection apparatus and improve its performance.

Because the generation of an inspection position can be made either by the inspection apparatus 10, the manufacturing apparatus 20 or the computer 60 separate from the two apparatus, as described above, it is possible to deal flexibly with the states of load of these apparatus and with any change in the inspection position generation method.

Figure 9:
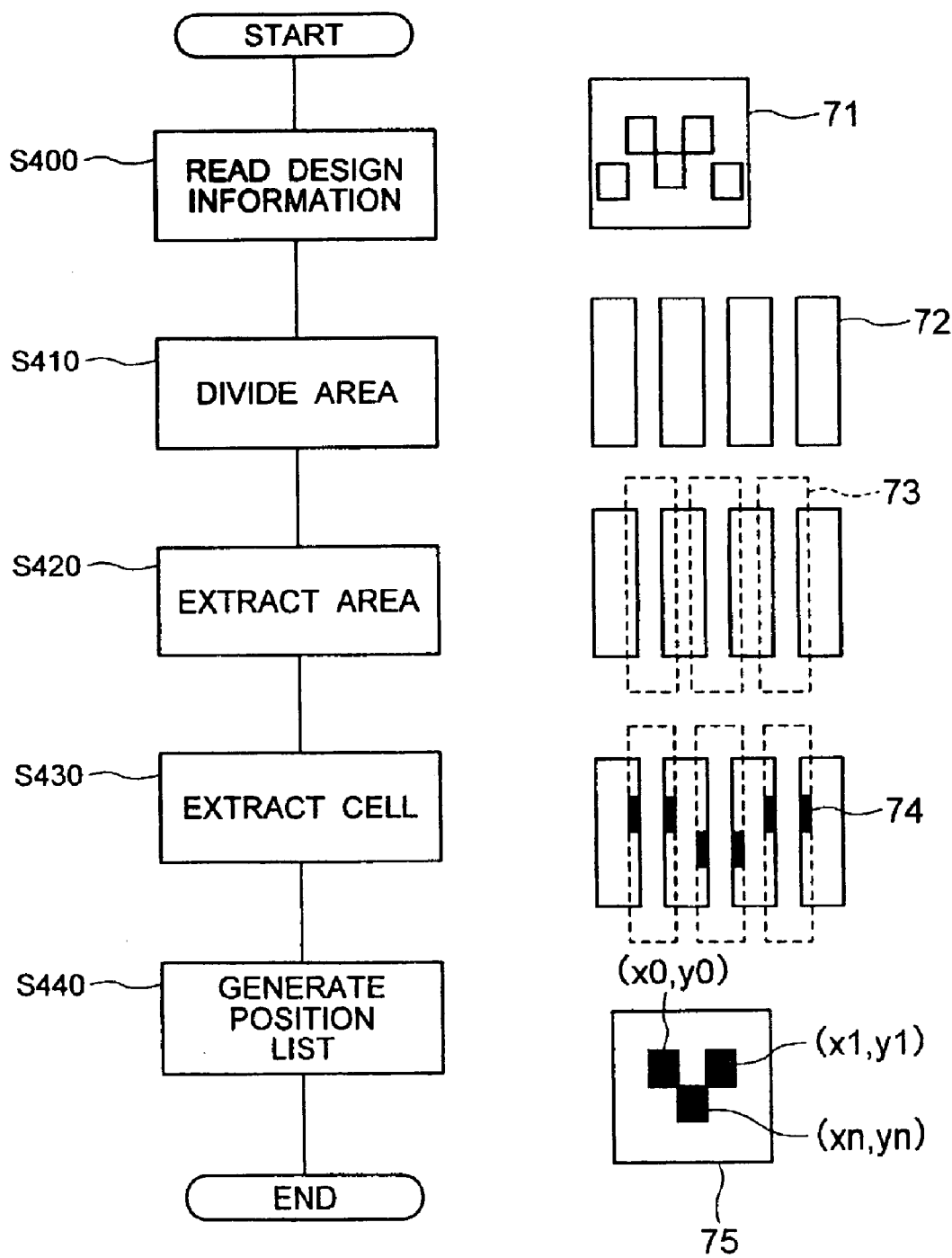
FIG. 9 is a diagram showing a sequence for generating an inspection position based on information on divided areas of design information.
Figure 10:
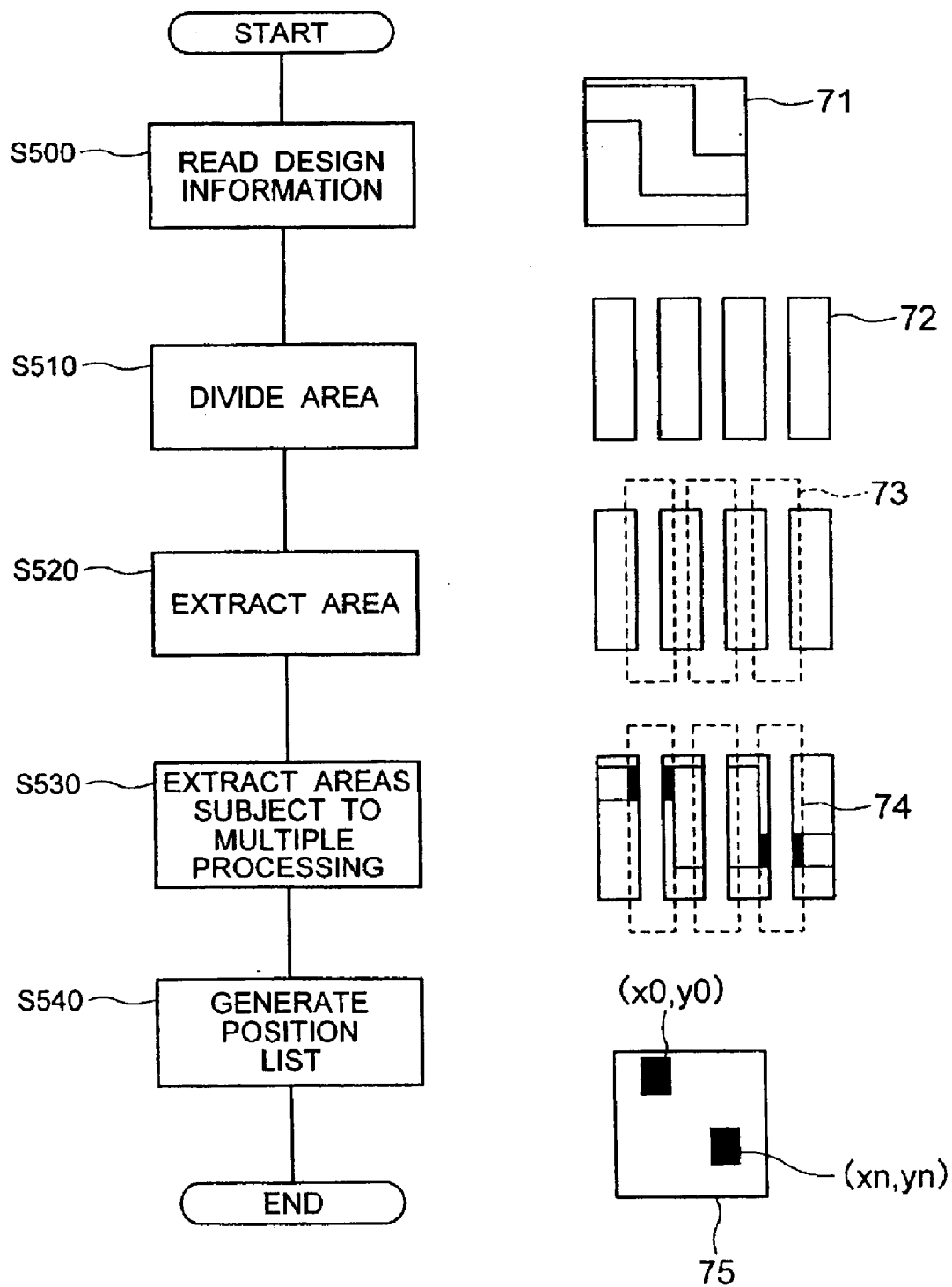
FIG. 10 is a diagram showing a sequence for generating an inspection position based on information on multiple processing caused by design information division.

FIG. 9 and FIG. 10 illustrate operation sequences for generating an inspection position. FIG. 9 shows a sequence for generating an inspection position based on information on divided areas of the design information. While the inspection position can be generated either by the inspection apparatus 10, the manufacturing apparatus or the computer 60, as shown in FIGS. 6, 7 and 8, this embodiment uses the manufacturing apparatus 20 in generating the inspection position.

First, the manufacturing apparatus 20 reads design information 71 from the storage device 30 (S400). Next, because many manufacturing apparatus 20 cannot process an entire area of the retrieved design information at one time, the design information is divided into, for example, stripes of divided information 72 (S410). Next, the manufacturing apparatus 20 extracts divided areas 73 including the boundaries between the divided information 72 (S420). There is a possibility that the divided areas 73 may include semiconductor cells that should have not been divided, such as transistors or other devices. Then, the divided cells are picked up (S430). Next, after the divided cells are extracted, the positions or areas of the divided cells are determined. From the divided cells are prepared a list of inspection positions which is then written into the storage device 30 (S440). By taking as inspection positions those portions that are likely to be affected by the division, the number of inspection positions can be reduced, improving the overall performance of the system.

FIG. 10 illustrates a sequence of operations for generating an inspection position based on information on multiple processing caused by design information division. As in FIG. 9, this sequence will be explained in an example case where the manufacturing apparatus 20 performs the sequence. First, the manufacturing apparatus 20 reads the design information 71 from the storage device 30 (S500). Many manufacturing apparatus 20 cannot process the entire area of the design information at one time, so the design information is divided into, for example, stripes of divided information 72 (S510). Next, divided areas 73 including boundaries of the divided information are extracted (S520). The divided areas 73 may include wires that should not have been divided. Because the divided wires are finally reconnected, the divided wires are often processed multiple times based on the information on those portions straddling the division. Therefore, the portions that are subject to multiple processing are extracted based on the divided wires (S530). Next, after the portions subject to multiple processing are extracted, the positions or areas of the divided wires are determined from the design information 71. From these positions a list of inspection positions is prepared which is then written into the storage device 30 (S540). By taking as inspection positions those portions that are likely to be affected by the multiple processing, it is possible to reduce the number of inspection positions and thereby improve the overall performance of the system.

Figure 11:
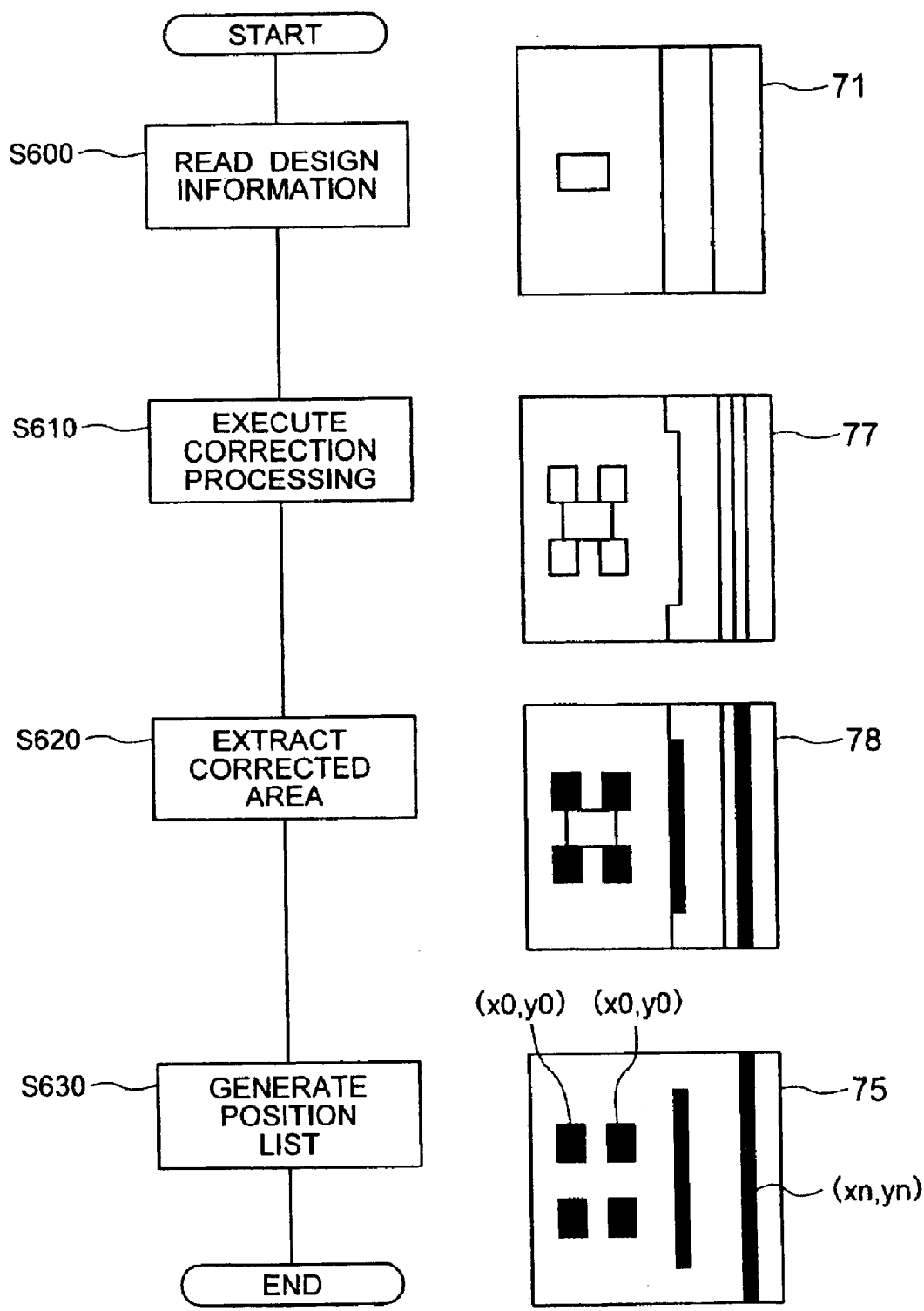
FIG. 11 is a diagram showing a sequence for generating an inspection position based on information on correction processing.

FIG. 11 shows a sequence of operations for generating an inspection position based on correction processing information. As in FIG. 9, this sequence will be explained in an example case where the manufacturing apparatus 20 executes the sequence. First, the manufacturing apparatus 20 reads design information 71 from the storage device 30 (S600). In the manufacturing apparatus 20 such as EB (electron beam direct writing system), a physical phenomenon such as refraction occurs due to the proximity effect of electron beams and therefore the writing result is not what is intended by the design information 71 even when the electron beam exposure is performed according to the design information. To deal with this problem Optical Proximity Correction (OPC) is carried out. There are two types of OPC, one based on rule and one based on simulation. This invention is not limited to a particular OPC method. Performing the OPC generates information 77 that incorporates a correction pattern (S610). Because the design information is often geometric data, the correction pattern can be determined by performing geometric logic calculations on both the original design information 71 and the information 77 incorporating the correction pattern. When the correction pattern is obtained, the position or area can be determined from the design information 71. The positions thus obtained are written into the storage device 30 in the form of a list of inspection positions (S630). By taking as inspection positions those portions that are likely to be affected by the correction processing, it is possible to reduce the number of inspection positions and thus improve the overall performance of the system.

Figure 12:
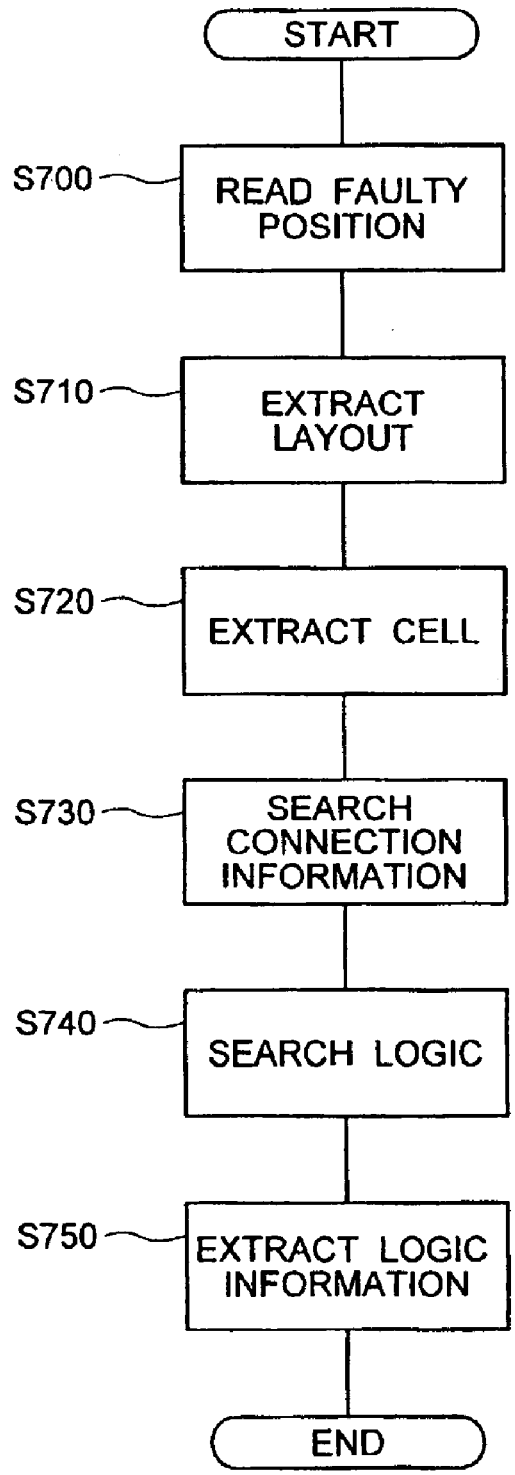
FIG. 12 is a diagram showing a sequence for identifying a logic corresponding to a faulty position based on information on the faulty position found by the inspection apparatus.

FIG. 12 shows a sequence of operations for identifying a logic corresponding to a faulty position based on information on the faulty position detected by the inspection apparatus. First, the inspection apparatus 10 reads a faulty position written into the storage device 30 (S700). Based on the faulty position, the inspection apparatus 10 extracts the corresponding position of layout information (S710). It then extracts cells such as transistors based on the extracted layout information (S720). The above steps are identical to the LVS (layout versus schematic) that is executed by the existing layout verification tool.

Next, a wire connected to the extracted cell is traced (S730). The same pattern as the traced pattern is searched from the logic information such as net list (S740). The logic information such as the net list including the searched logic is extracted (S750).

In this embodiment an inspection can be performed retroactively from the logic generation step or upstream step in the semiconductor manufacturing process. This makes it possible to decide whether the failure can be alleviated by changing the logic, thus improving the yield.

Figure 13:
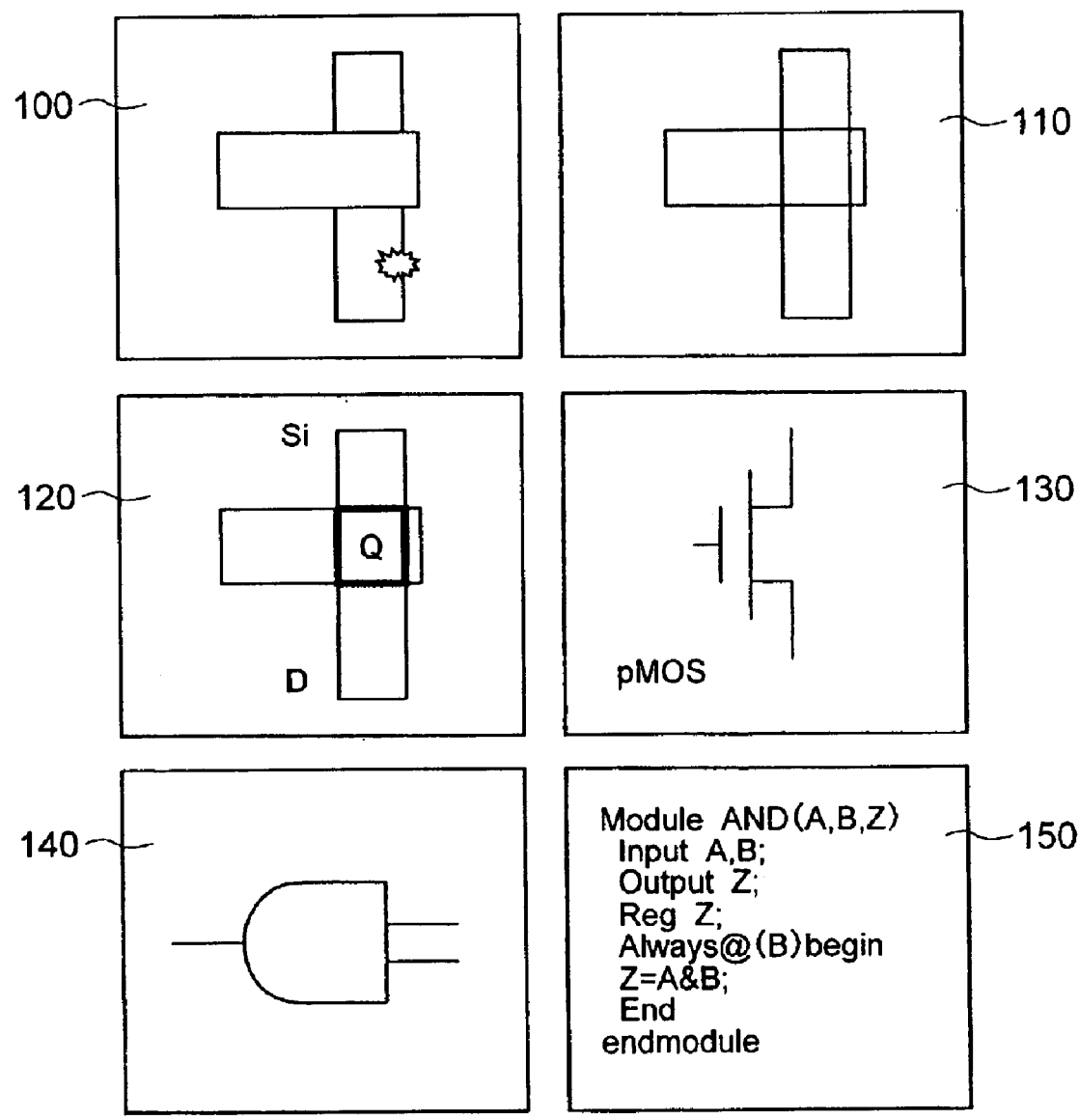
FIG. 13 is a diagram showing an example that simultaneously displays inspection images of faulty positions.

FIG. 13 shows an example case in which a screen displays an inspection image of a faulty location, layout information on the faulty location, cell library information, cell device information, logic symbols and a logic description at one time. In the figure, a screen simultaneously displays an actual image 100 observed by the inspection apparatus 10, layout information 110 corresponding to the actual image, cell library information 120 present at the layout position, device information 130 in the cell library, a logic 140 corresponding to the device, and a logic description 150 by which the logic is formed.

There has been a technique which inspects a failure by displaying the inspection image and the layout information in a superimposed state. The conventional technique, however, can only make decisions on failures in such a way that impurities spanning the wires are considered as faulty and that impurities not spanning the wires are considered not faulty. On the other hand the present invention displays the logic information too, so if a wire failure is associated with a clock, for example, this is considered to have grave effects on the system as a whole and is decided to be a failure. In this way the decision on failure can be increased in severity.

Figure 14:
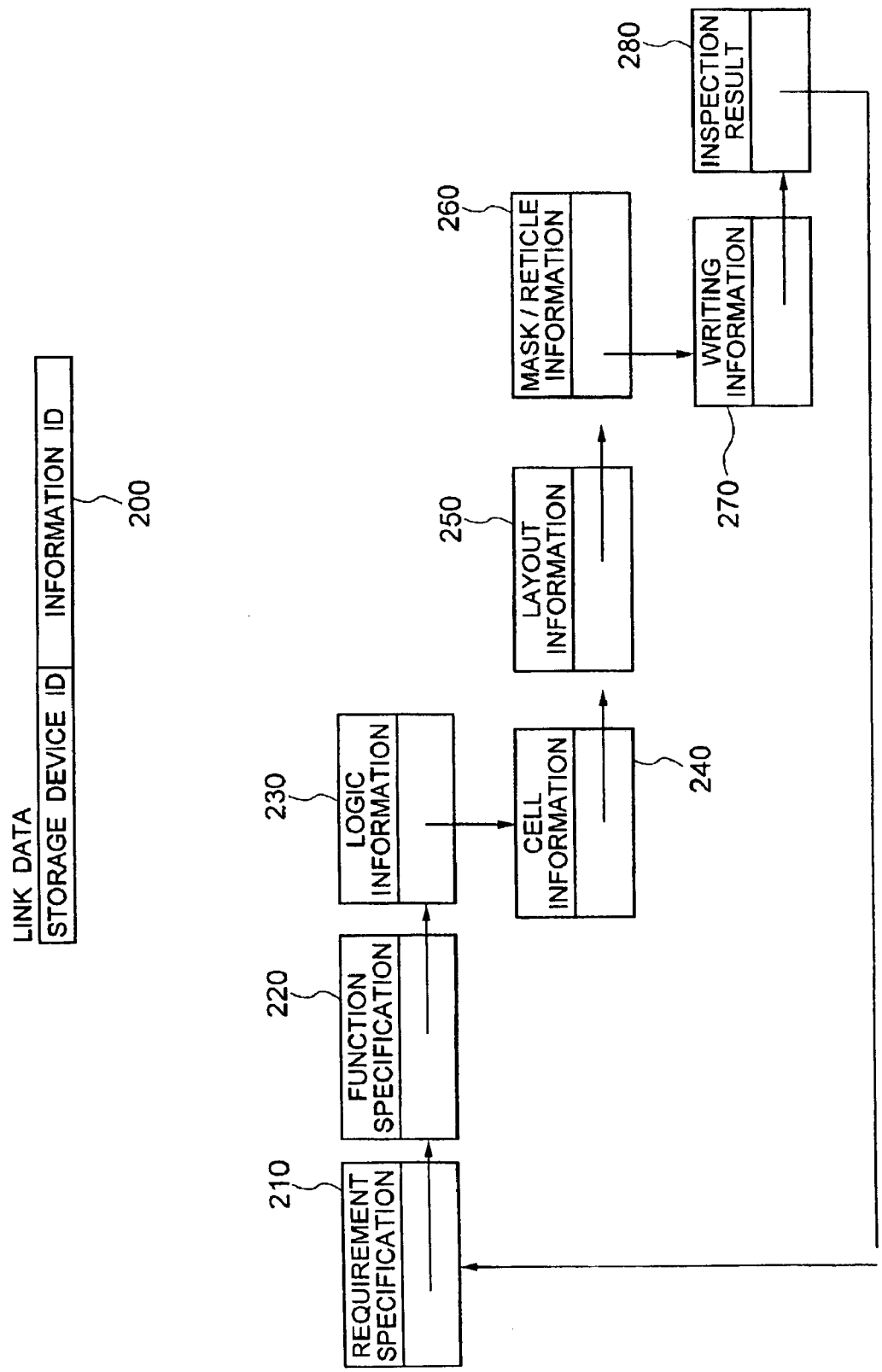
FIG. 14 is a diagram showing an example that displays link data for retrieving a variety of information associated with semiconductor manufacturing.

FIG. 14 shows an example case in which individual kinds of information associated with the semiconductor manufacturing are provided with link data. In this embodiment, link data 200 is used which links a storage device ID for identifying a storage device 30 with an ID of the information itself. That is, the link data 200 is added to individual kinds of information so that requirement specification information 210, function specification information 220, logic information 230, cell information 240, layout information 250, mask/reticle information 260, writing information 270, and inspection result 280 can be associated with one another by the link data 200. Matching such link directions with an actual manufacturing process allows the information link to be utilized as the log information in the manufacturing process.

Figure 15:
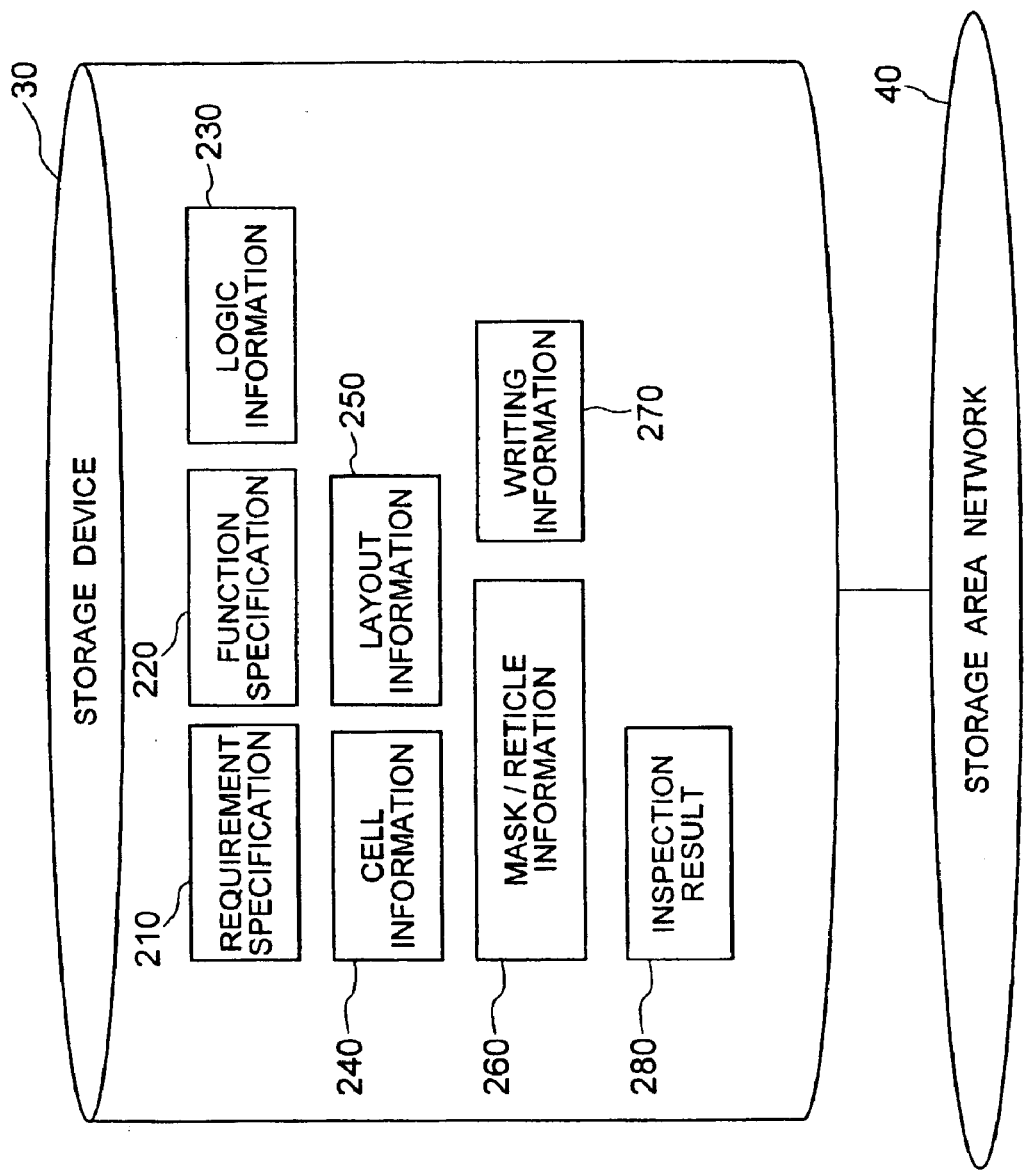
FIG. 15 is a diagram showing an example in which a variety of information is stored in a physically single storage device.

FIG. 15 shows an example case in which different kinds of information are stored in a physically single storage device. As shown in the figure, the requirement specification information 210, the function specification information 220, the logic information 230, the cell information 240, the layout information 250, the mask/reticle information 260, the writing information 270 and the inspection result 280 are stored in one storage device 30. By storing all kinds of information in one storage device 30, desired information can be accessed quickly by tracing the link data 200.

Figure 16:
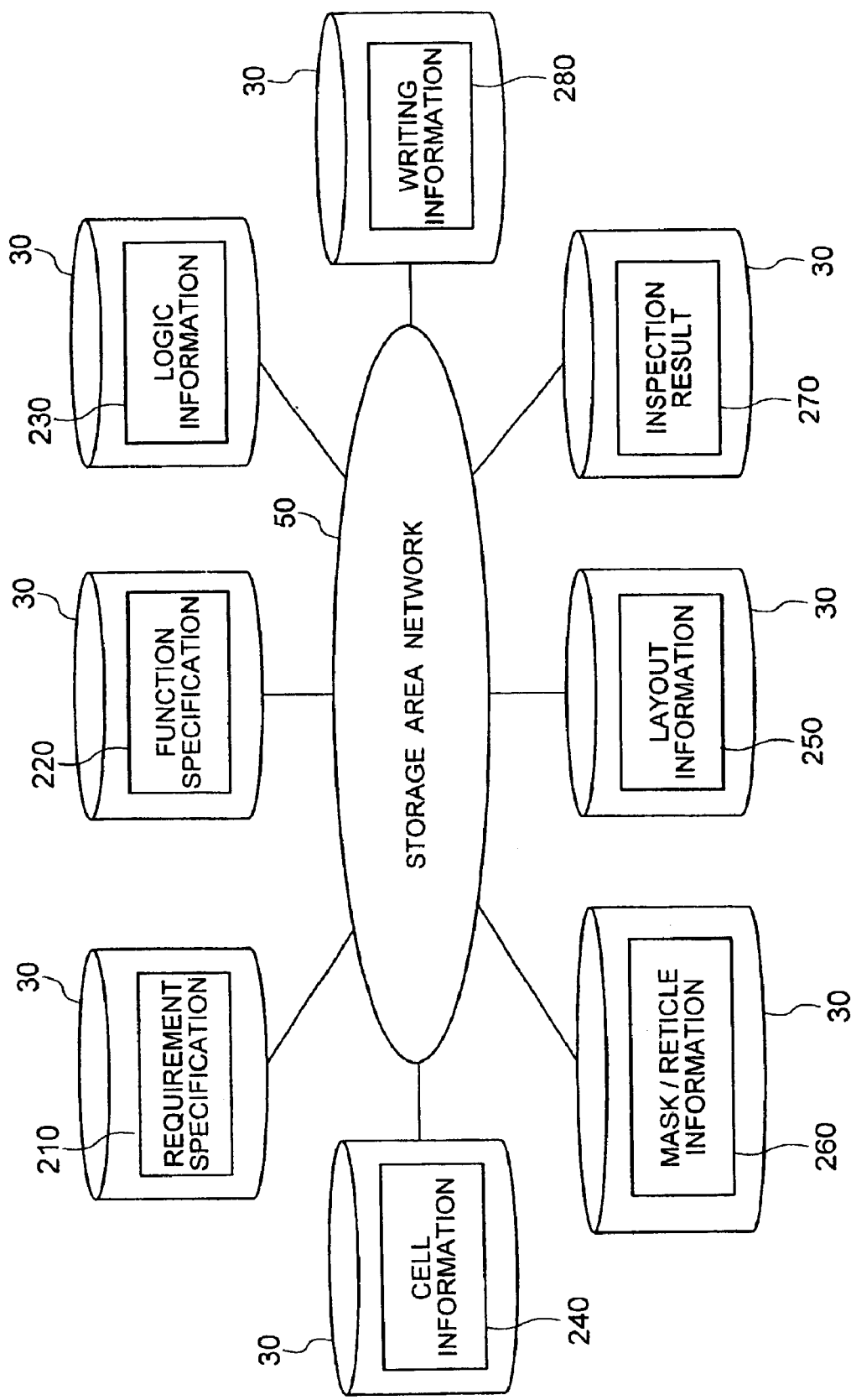
FIG. 16 is a diagram showing an example in which a variety of information is stored in physically different storage devices.

FIG. 16 shows an example case where different kinds of information are stored in physically different storage devices. As shown in the figure, the requirement specification information 210, the function specification information 220, the logic information 230, the cell information 240, the layout information 250, the mask/reticle information 260, the writing information 270 and the inspection result 280 are each stored in different storage devices 30. Storing different kinds of information in different storage devices 30 can minimize a possible damage to the storage device 30 when compared with the storage configuration shown in FIG. 15.

Figure 17:
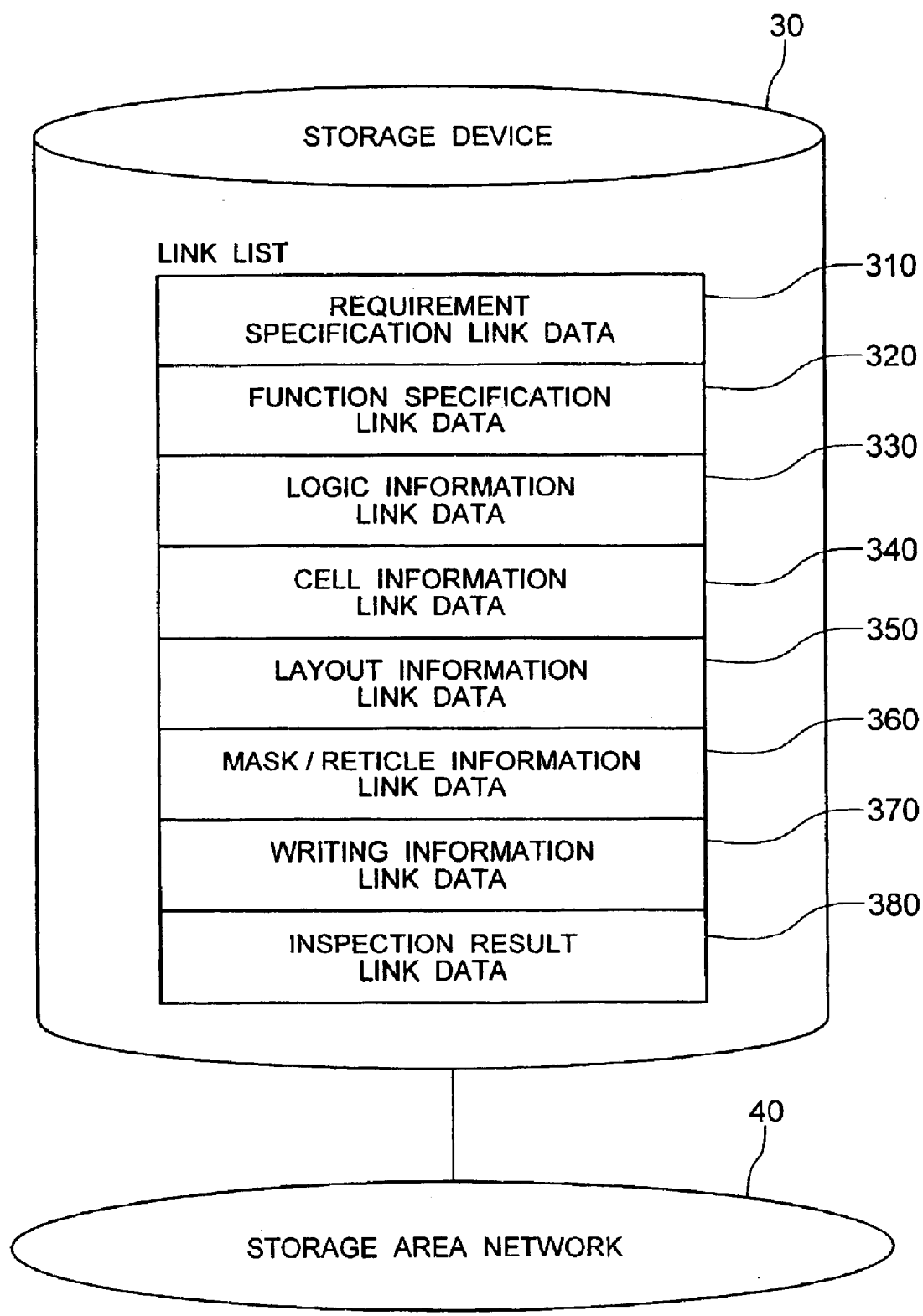
FIG. 17 is a diagram showing an example in which only the link data is stored independently.

FIG. 17 shows an example case where only the link data is independently stored. Requirement specification information link data 310, function specification information link data 320, logic information link data 330, cell information link data 340, layout information link data 350, mask/reticle information link data 360, writing information link data 370 and inspection result link data 380 are collected as an independent link list to enable a faster access to desired information than with the search through the unidirection list of FIG. 14.

FIG. 18 shows an example table that records a correlation among an allowable range in inspection, an inspection result and a performance of a final product. A correlation table 400 stores an allowable range 410 specified during the inspection, an actually measured value 420 within the specified range, and a final performance of a product with the actually measured value 420, such as a clock frequency. The above-described items can be sorted and the actually measured values can be classified into regions by performance level.

Figure 19:
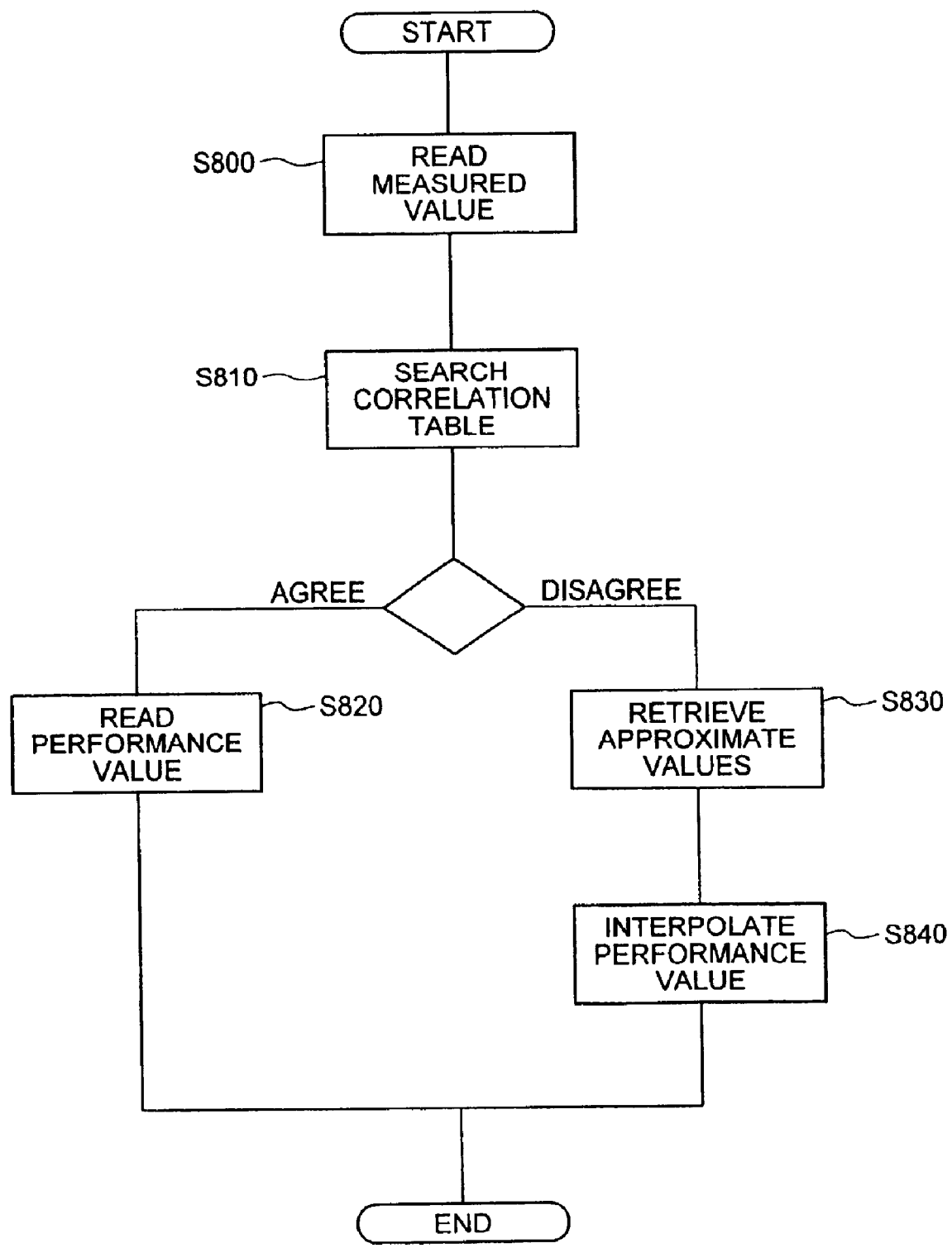
FIG. 19 is a diagram showing a sequence for estimating a performance from the inspection result.

FIG. 19 shows a sequence for estimating a performance from the inspection result. First, the inspection apparatus 10 reads a measured value written into the storage device 30 (S800) and, based on the measured value thus read out, searches through the correlation table 400 (S810). When the search result produces data that matches the measured value 420, the inspection apparatus 10 reads a performance value 430 corresponding to the data (S820). If no data matching the measured value 420 is found, then a search is made in positive and negative directions to find data close to the measured value 420 and retrieve two approximate values (S830). Performance values 430 corresponding to these approximate values are determined to calculate a performance value by interpolation (S840). By estimating the performance from the inspection result of the inspection apparatus 10 in this way, the performance can be estimated during the inspection process without actually evaluating the performance of the semiconductor product.

Figure 20:
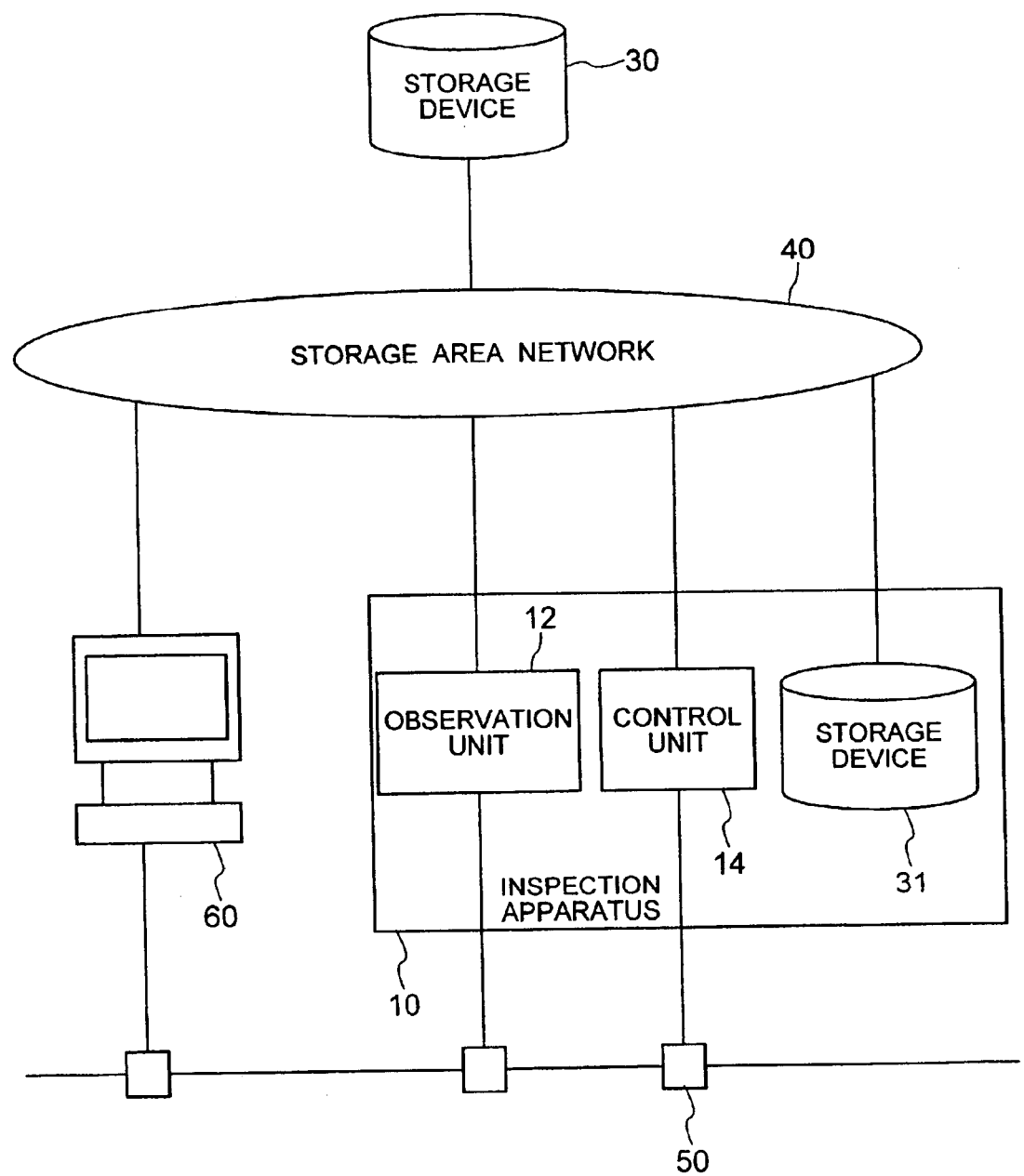
FIG. 20 is a diagram showing an overall configuration of the semiconductor inspection apparatus.

FIG. 20 to FIG. 23 are block diagrams showing semiconductor inspection apparatus as embodiments of the present invention. FIG. 20 is a block diagram showing an overall configuration. As shown in the figure, the inspection apparatus 10 comprises an observation unit 12 having an optical image sensing device and others and a control unit 14 for controlling the observation unit. The observation unit 12 and the control unit 14 are connected through the storage area network 40 to a storage device 30 outside the inspection apparatus, a storage device 31 inside the inspection apparatus, and an apparatus 60 other than the inspection apparatus. This configuration allows the storage devices to be shared among various apparatus.

Figure 21:
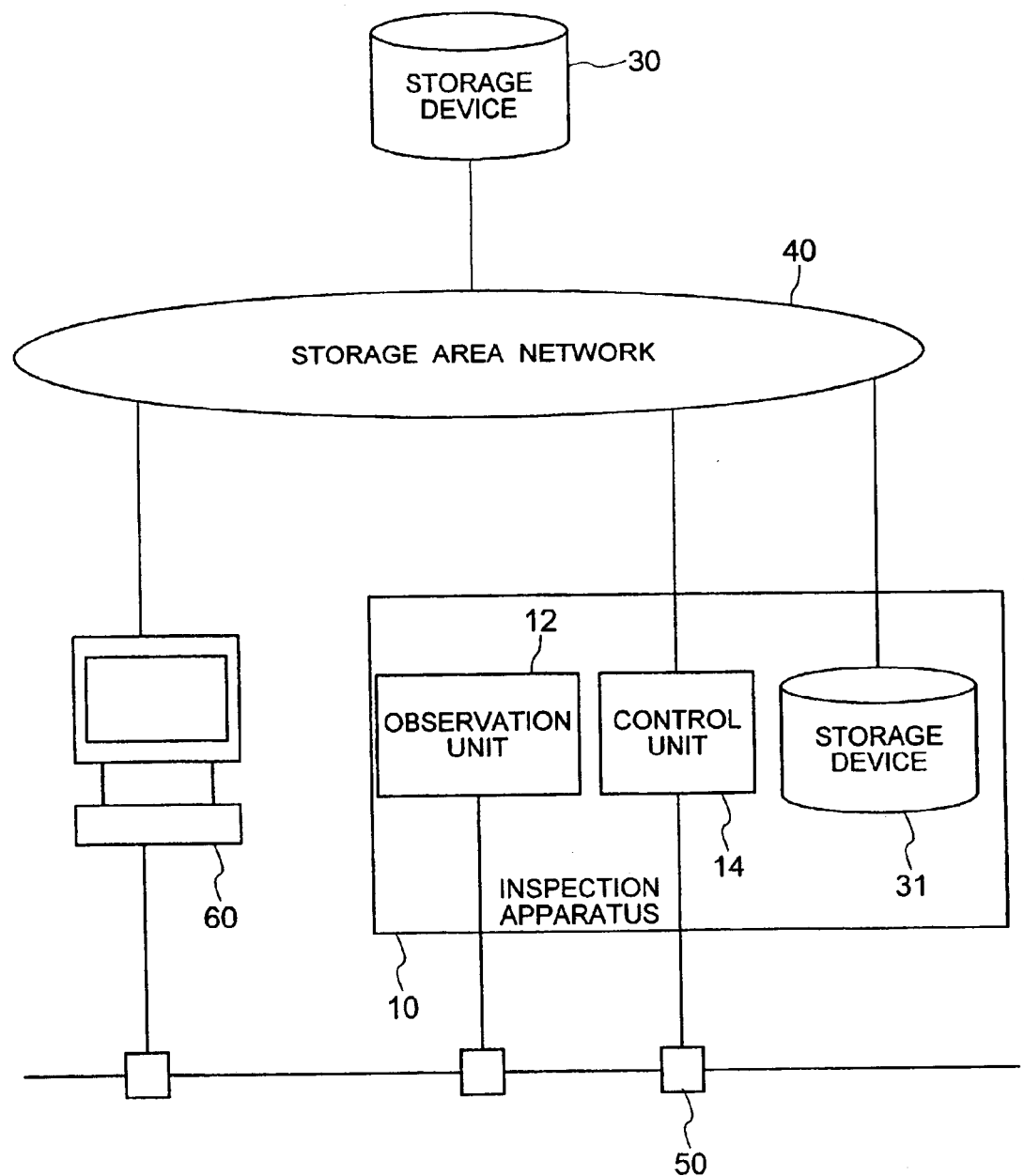
FIG. 21 is a block diagram showing a semiconductor inspection apparatus with its control unit connected to the storage area network.

FIG. 21 is a block diagram showing a semiconductor inspection apparatus with its control unit connected to the storage area network. As shown in the figure, the inspection apparatus 10 comprises an observation unit 12 having an optical image sensing device and others and a control unit 14 for controlling the observation unit. The control unit 14 is connected through the storage area network 40 to a storage device 30 outside the inspection apparatus, a storage device 31 inside the inspection apparatus, and an apparatus 60 other than the inspection apparatus. This configuration allows the control unit to access all the storage devices inside or outside the apparatus.

Figure 22:
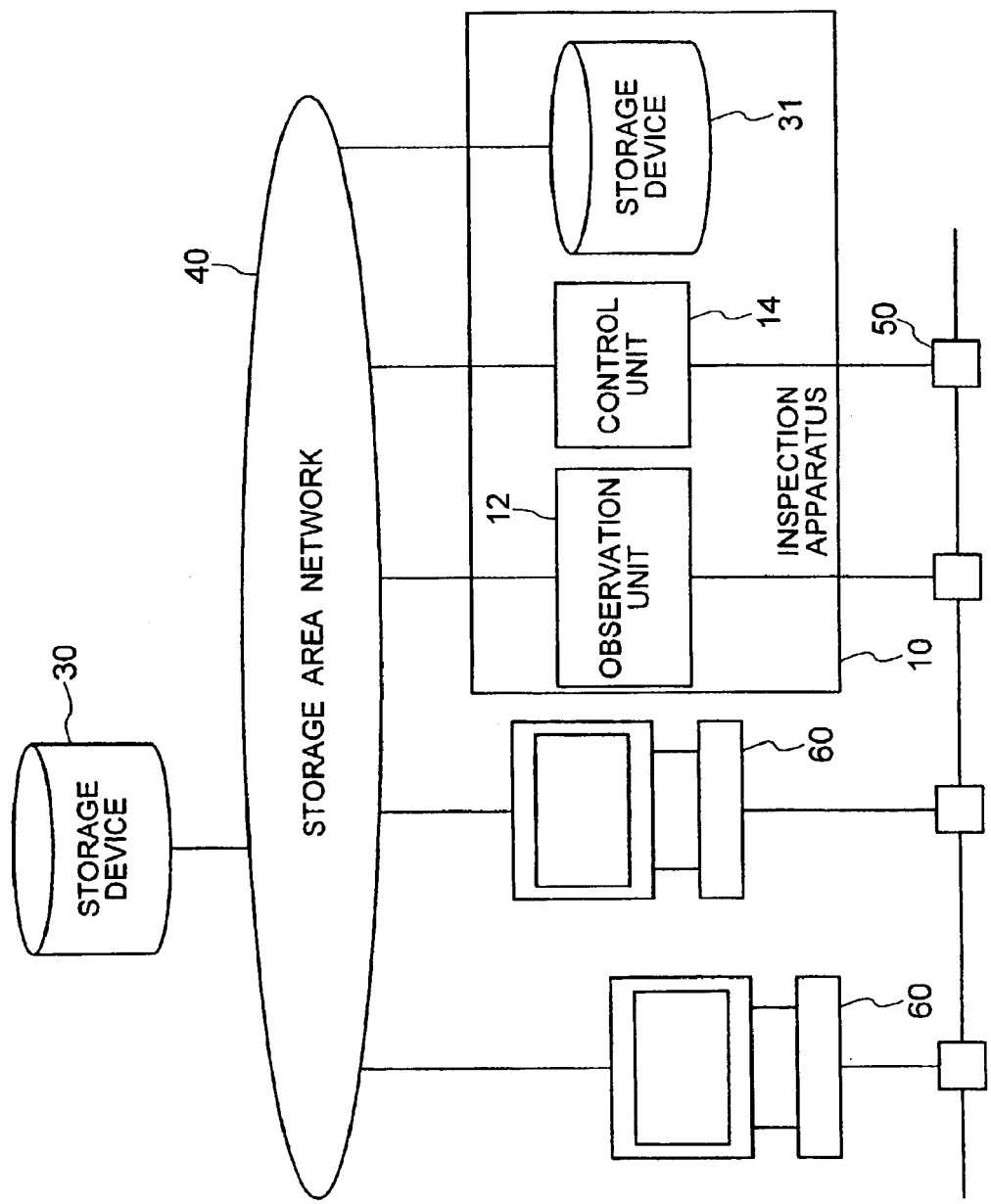
FIG. 22 is a block diagram showing a semiconductor inspection apparatus with a plurality of inspection processing apparatus connected to the storage area network.

FIG. 22 is a block diagram showing a semiconductor inspection apparatus with a plurality of inspection processing apparatus connected to the storage area network. As shown in the figure, the inspection apparatus 10 comprises an observation unit 12 having an optical image sensing device and others and a control unit 14 for controlling the observation unit. The observation unit 12 and the control unit 14 are connected through the storage area network 40 to a storage device 30 outside the inspection apparatus, a storage device 31 inside the inspection apparatus, and a plurality of inspection processing apparatus 60. In this configuration, when image data obtained by the inspection apparatus 10 is stored in the external storage device 30, a plurality of inspection processing apparatus 60 can easily access the image data stored in the storage device 30, making it possible to easily realize parallel inspection processing and thereby improve the overall performance of the system. Further, because an inspection processing apparatus 60 can be added to or removed from the storage area network 40 while the system is in operation, the configuration of the inspection processing apparatus 60 can be modified according to variations in the system load.

Figure 23:
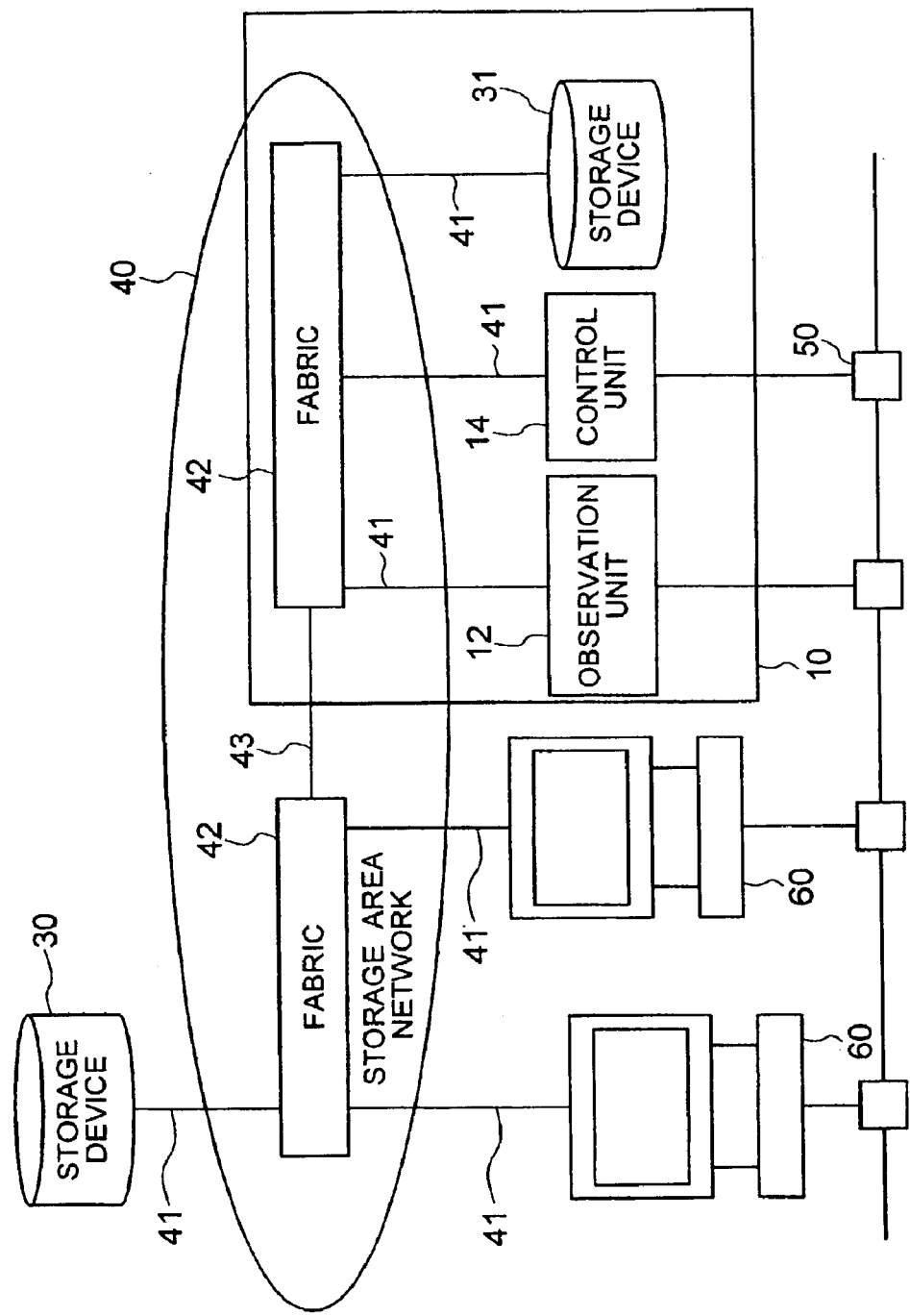
FIG. 23 is a block diagram showing a semiconductor inspection apparatus when a fiber channel is employed as the storage area network.

FIG. 23 is a block diagram showing a semiconductor inspection apparatus when a fiber channel is employed as the storage area network. As shown in the figure, inspection apparatus 10 comprises an observation unit 12 having an optical image sensing device and others and a control unit 14 for controlling the observation unit. The observation unit 12 and the control unit 14 are connected through the storage area network 40 to a storage device 30 outside the inspection apparatus, a storage device 31 inside the inspection apparatus, and a plurality of inspection processing apparatus 60. The storage area network 40 has a plurality of fabrics 42, to each of which the units and apparatus are connected via fiber channels 41. The fabrics 42 are interconnected also by a fiber channel 43. In this case, when the connections 43 between a plurality of fabrics are replaced with WAN such as ATM, the inspection apparatus may be installed in a clean room at the manufacturing site and the inspection processing apparatus in a remote office.

Figure 24:
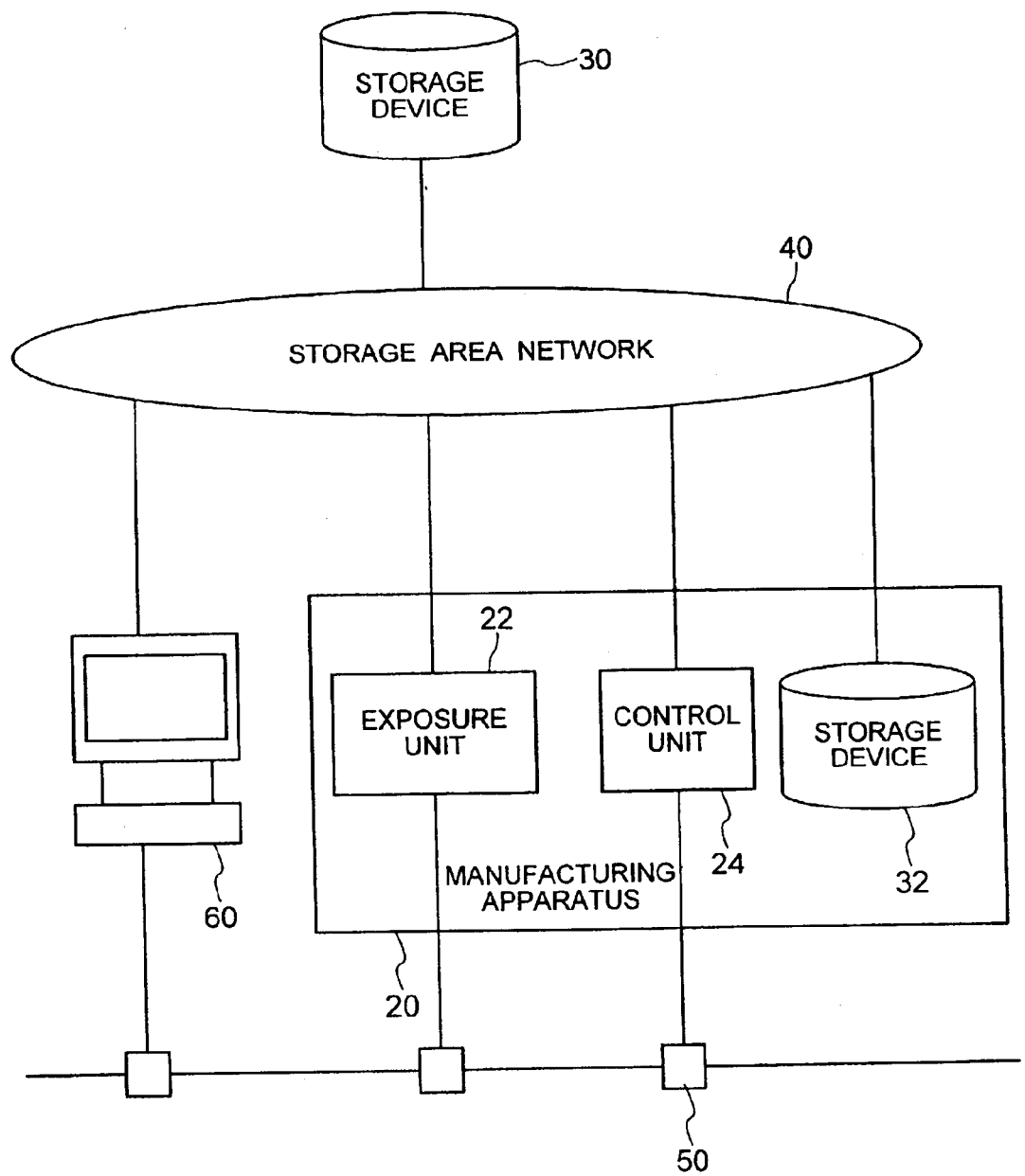
FIG. 24 is a block diagram showing an overall configuration of a semiconductor manufacturing apparatus.
Figure 25:
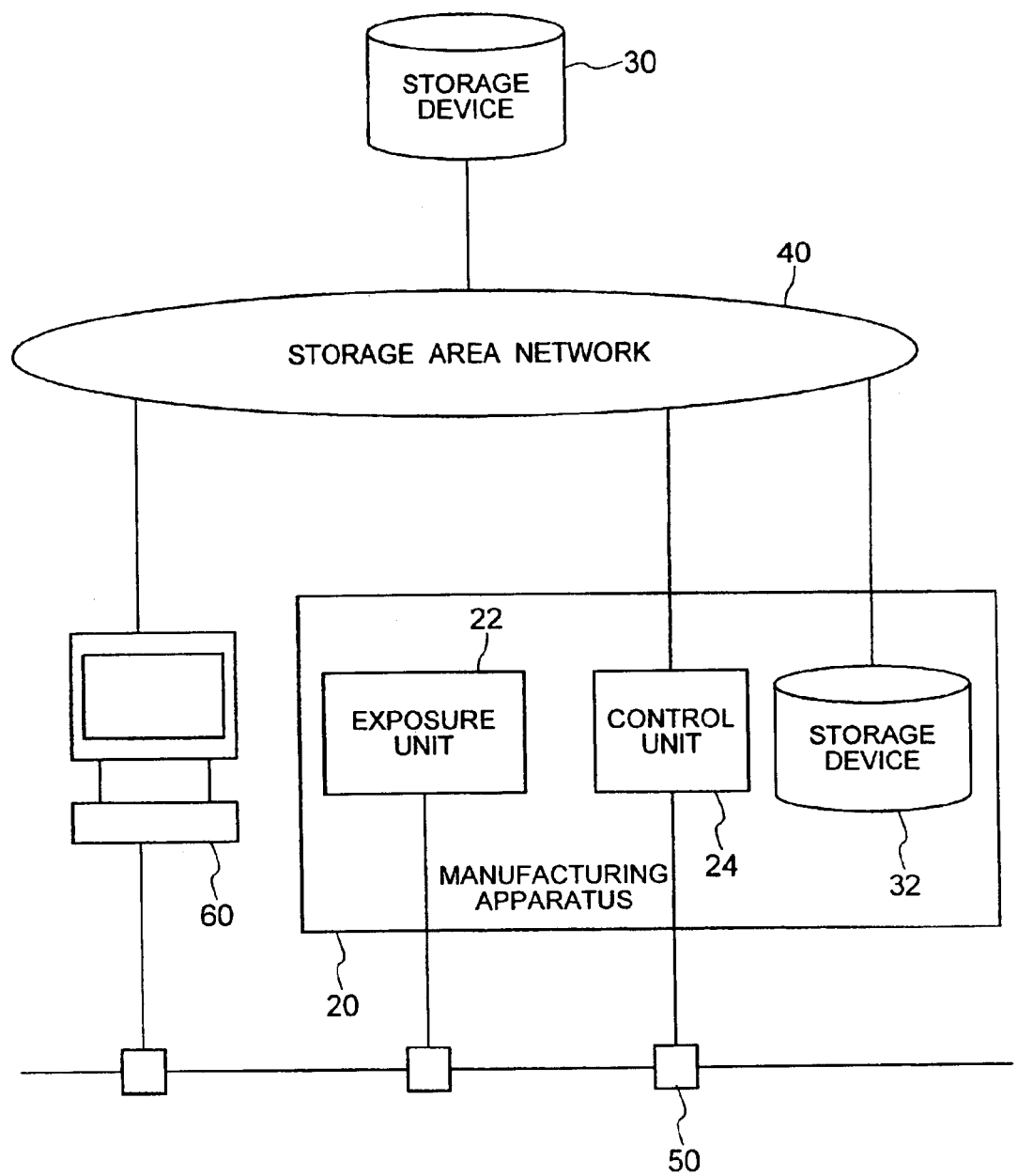
FIG. 25 is a block diagram showing a semiconductor manufacturing apparatus with its control unit connected to the storage area network.

FIG. 24 and FIG. 25 are block diagrams showing semiconductor manufacturing apparatus as embodiments of this invention. FIG. 24 is a block diagram showing an overall configuration of the system. As shown in the figure, the manufacturing apparatus 20 comprises an exposure unit 22 having an optical exposure means or charged particle exposure means, and a control unit 24 for controlling the exposure unit. The exposure unit 22 and the control unit 24 are connected through the storage area network 40 to a storage device 30 outside the manufacturing apparatus, a storage device 32 inside the manufacturing apparatus, and an apparatus 60 other than the manufacturing apparatus 20. This configuration allows the storage devices to be shared among the units and apparatus.

FIG. 25 is a block diagram showing a semiconductor manufacturing apparatus with its control unit connected to the storage area network. As shown in the figure, the manufacturing apparatus 20 comprises an exposure unit 22 having an optical exposure means or charged particle exposure means, and a control unit 24 for controlling the exposure unit. The control unit 24 is connected through the storage area network 40 to a storage device 30 outside the manufacturing apparatus, a storage device 32 inside the manufacturing apparatus, and an apparatus 60 other than the manufacturing apparatus 20. This configuration allows the control unit to access all the storage devices inside or outside the manufacturing apparatus.

Figure 26:
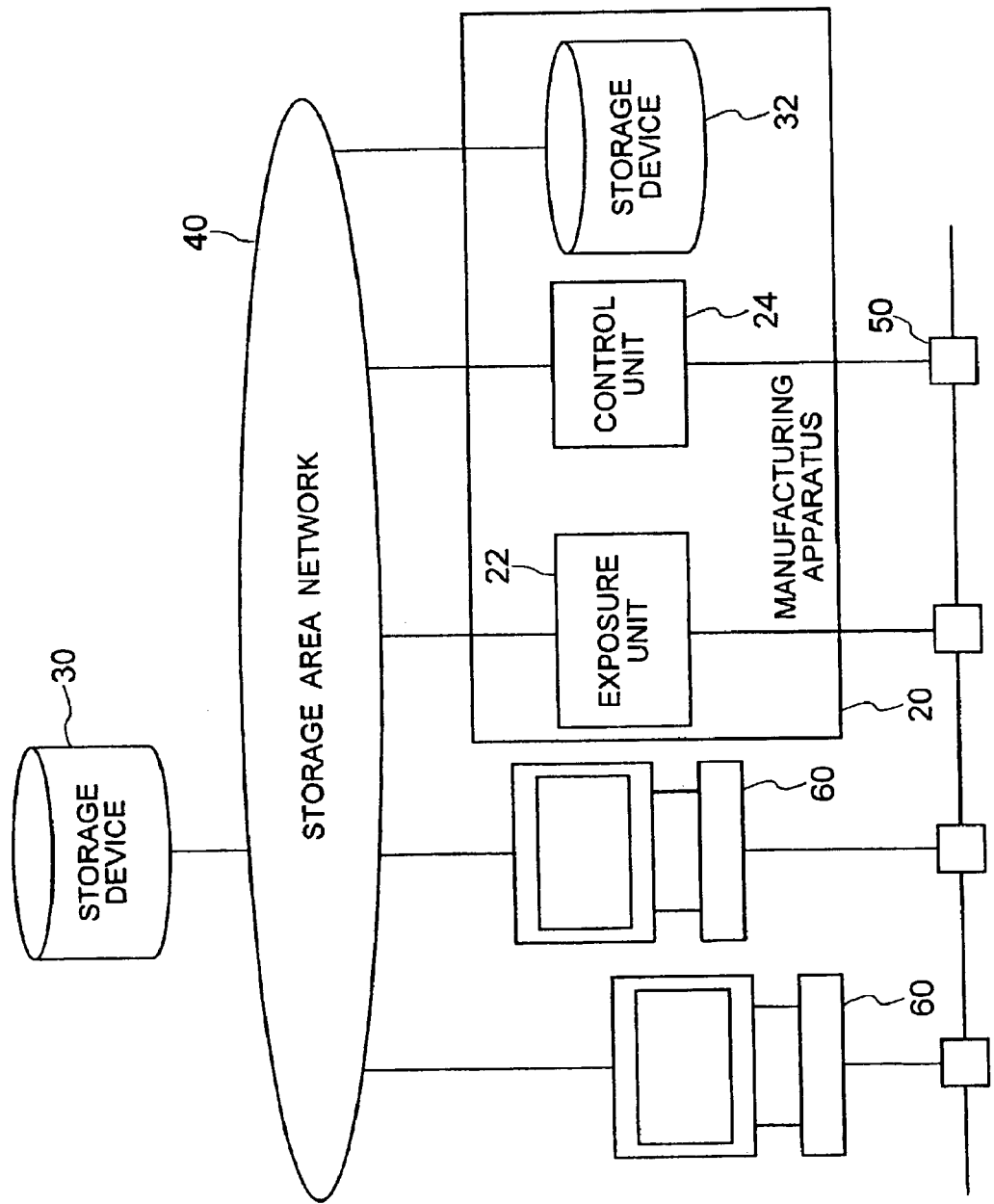
FIG. 26 is a block diagram showing a semiconductor manufacturing apparatus with a plurality of design information processing apparatus connected to the storage area network.

FIG. 26 is a block diagram showing a semiconductor inspection apparatus with a plurality of design information processing apparatus 60 connected to the storage area network. As shown in the figure, the manufacturing apparatus 20 comprises an exposure unit 22 having an optical exposure means or charged particle exposure means, and a control unit 24 for controlling the exposure unit. The exposure unit 22 and the control unit 24 are connected through the storage area network 40 to a storage device 30 outside the manufacturing apparatus, a storage device 32 inside the manufacturing apparatus, and a plurality of design information processing apparatus 60. With this configuration, because a plurality of design information processing apparatus 60 can store in the storage device 30 design information processed for use in the manufacturing apparatus 20, the parallel manufacture processing can easily be realized, thus improving the overall performance of the system. A design information processing apparatus 60 can be added to or removed from the storage area network while the system is in operation. Hence, when new design information processing is requested, an additional design information processing apparatus can be added without halting the system, thus improving the system extension capability.

Figure 27:
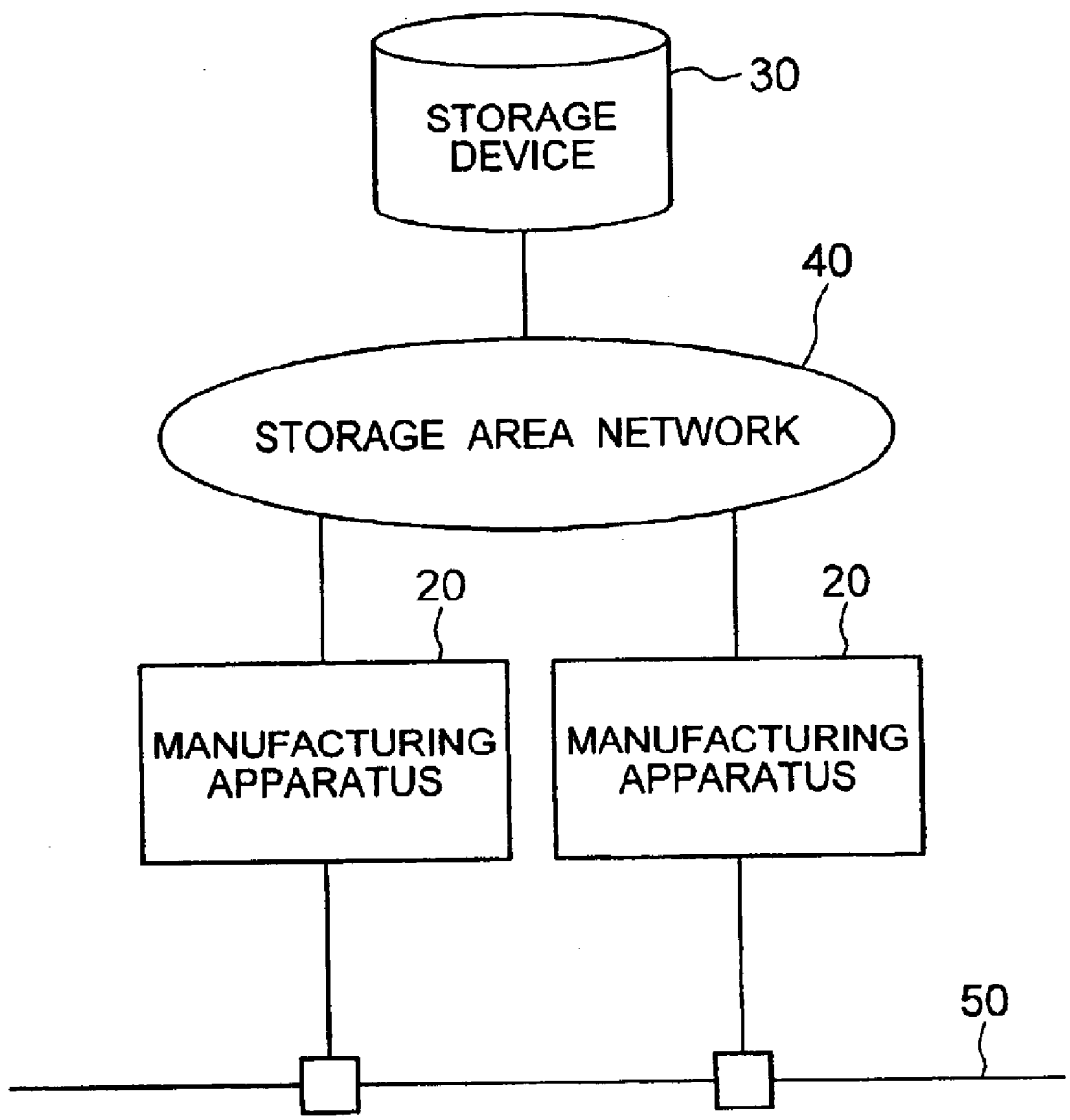
FIG. 27 is a block diagram showing a plurality of semiconductor manufacturing apparatus connected to the storage area network.

FIG. 27 is a block diagram showing an example case where a plurality of semiconductor manufacturing apparatus are connected to the storage area network. As shown in the figure, a plurality of manufacturing apparatus 20 can access design information stored in the storage device 30 via the storage area network. Therefore, for the same design information a plurality of manufacturing apparatus can parallelly execute the manufacturing process at the same time, improving the overall performance of the system.

Figure 28:
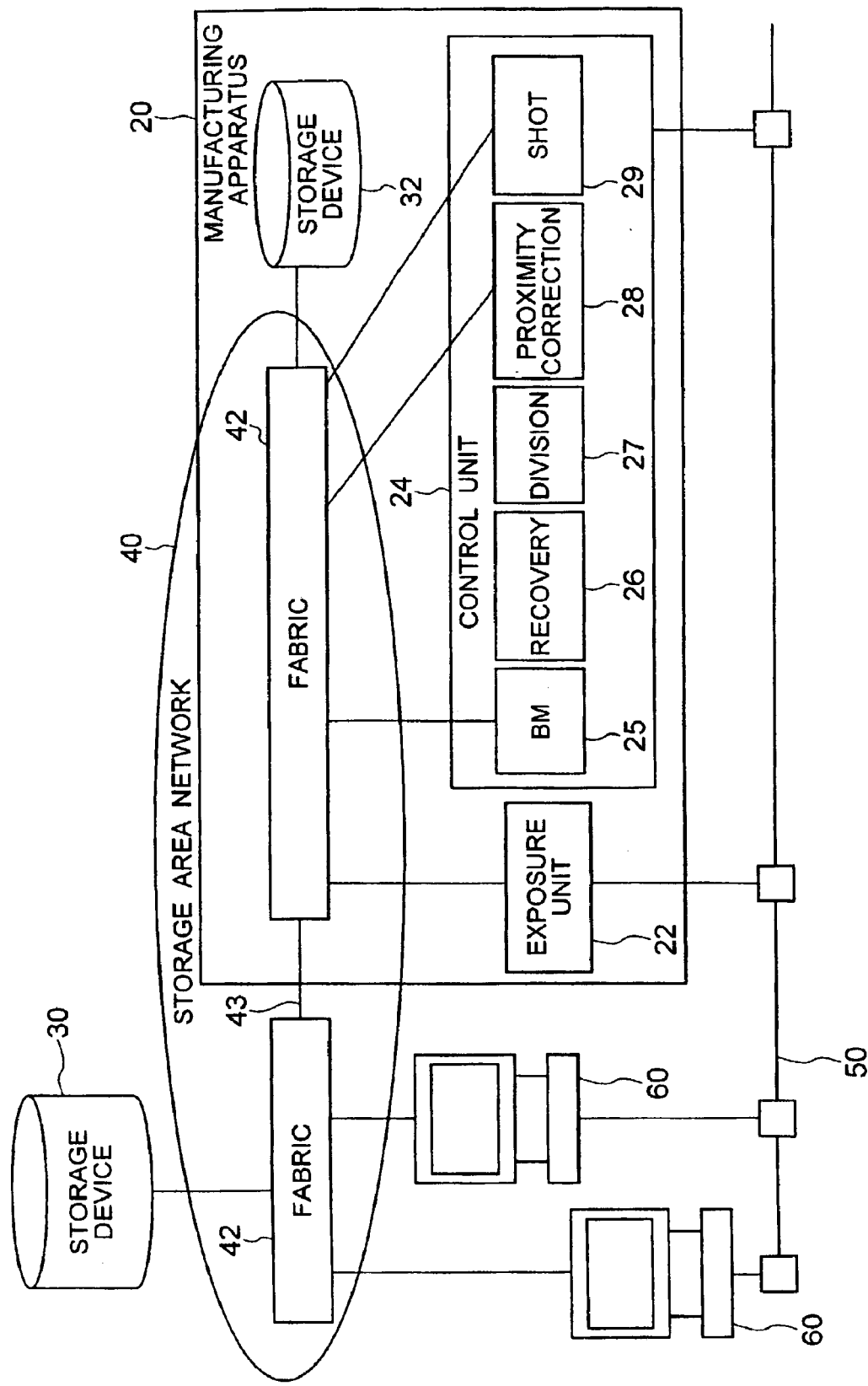
FIG. 28 is a diagram showing a semiconductor manufacturing apparatus when a fiber channel is used as the storage area network and dedicated hardware is mounted in its control unit.

FIG. 28 is a block diagram showing a semiconductor manufacturing apparatus when a fiber channel is adopted for the storage area network and a dedicated hardware is used for the control unit. As shown in the figure, the manufacturing apparatus 20 comprises an exposure unit 22 having an optical exposure means or charged particle exposure means, and a control unit 24 for controlling the exposure unit. The exposure unit 22 and the control unit 24 are connected through the storage area network 40 to a storage device 30 outside the manufacturing apparatus, a storage device 32 inside the manufacturing apparatus, and a plurality of design information processing apparatus 60. The storage area network 40 has a plurality of fabrics 42, to which various units and apparatus are connected by fiber channels 41. The fabrics 42 are interconnected also by the fiber channel 43. The control unit 24 comprises a BM (buffer memory) 25 for temporarily storing design information, a recovery unit 26 for processing the design information for use in the control unit 24, a dividing unit 27 for dividing the data processed by the recovery unit 26 into minimum geometric units such as rectangles, a proximity correction unit 28 for executing a proximity effect correction on the minimum geometric units divided by the dividing unit, and a shot unit 29 for converting the data into shot information conforming to the exposure unit 22.

The conventional control unit 24 implemented with hardware is a black box whose inner data cannot be accessed. With this embodiment, however, the data contained in the control unit 24 can be accessed via the fiber channels. Hence, the correction result produced by the proximity correction unit 28 and the actual shot specification information produced by the shot unit 29 can be retrieved and, based on these information, new functions can be provided.

Figure 29:
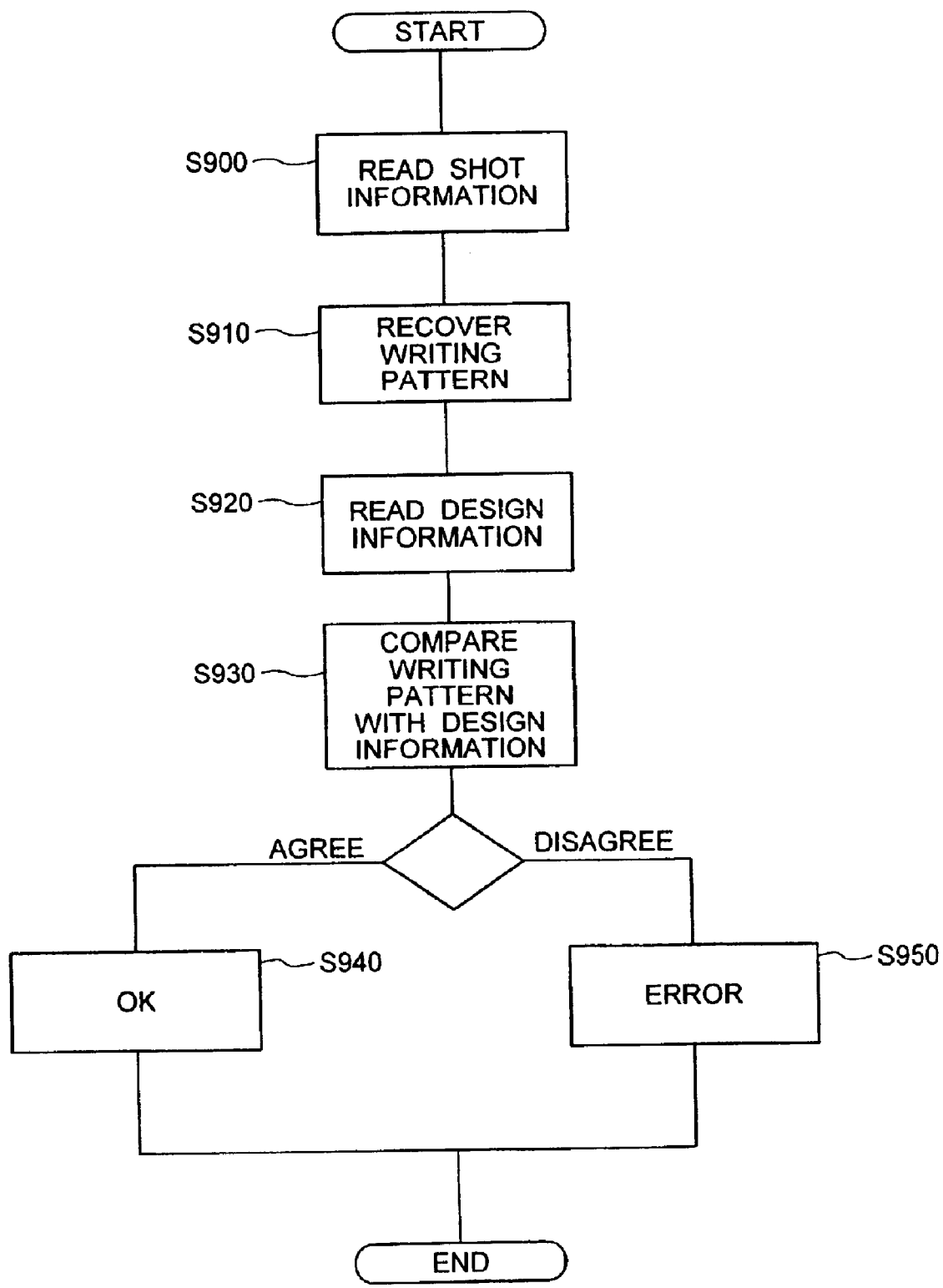
FIG. 29 is a diagram showing a sequence for seeking accuracy of manufacturing process by comparing shot information stored in a storage device with design information on which the shot information is based.

FIG. 29 shows a sequence of operations for determining the accuracy of the manufacturing process by comparing the shot information stored in the storage device with the design information from which the shot information has been derived. An example case where the sequence is applied to the semiconductor manufacturing apparatus of FIG. 28 will be explained.

First, the shot information stored in the storage device 30 or storage device 32 (S900) is read out and, based on the shot information read out, the writing pattern is recovered (S910). The shot information is a set of minimum geometric units such as rectangles and the writing pattern can be recovered by performing interpolation between the unit geometries. Next, design information is read out (S920). The formats of the writing pattern and the design information are often CAD data or vector data and, when the format of the design information differs from that of the writing pattern, it needs to be converted. Then, the writing pattern and the design information are compared (S930). When they agree, it is decided that the processing has been executed accurately (S940). When they disagree, it is decided that the processing was not accurate (S950). When they disagree, the location of disagreement is stored in the storage device 30 so that the stored information may be used as control data for a micro-fabrication machine using FIB (focused ion beam) which is connected to the storage area network 40.

Figure 30:
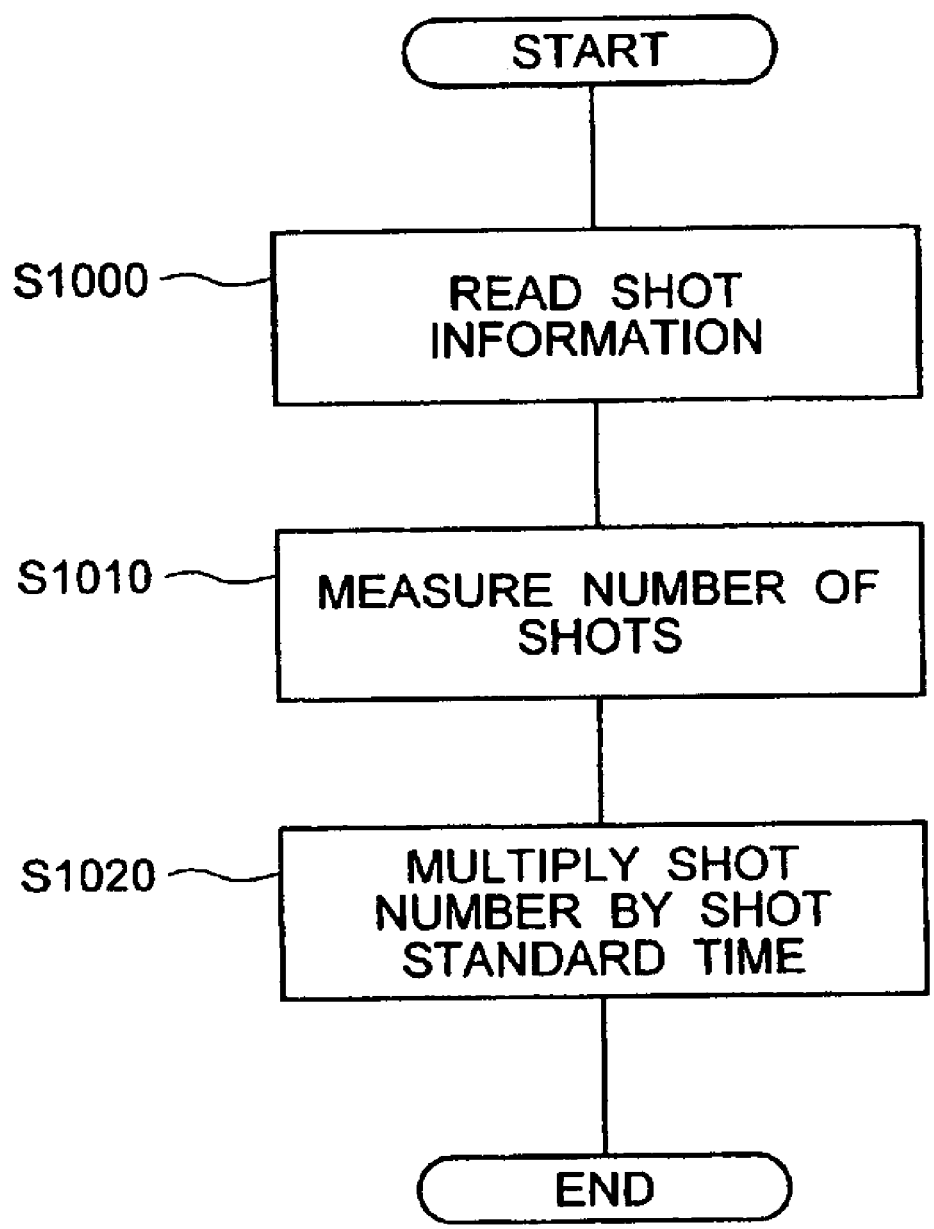
FIG. 30 is a diagram showing a sequence for estimating a processing time taken by the semiconductor manufacturing apparatus.

FIG. 30 shows a sequence for estimating a processing time taken by the semiconductor manufacturing apparatus. First, the shot information is read out from the storage device 30 (S1000). From the shot information thus read out, the number of shots is measured (S1010). The shot information is a set of minimum geometric units such as rectangles, as described above, and the total of the geometric units represents the number of shots. The number of shots measured is multiplied by a shot standard time taken by each minimum geometric unit of the manufacturing apparatus (S1020). If there are two or more kinds of minimum geometric units and the shot standard time differs from one geometric unit kind to another, the number of shots is measured for each kind of minimum geometric unit and is multiplied by the shot standard time of each minimum geometric unit kind. The multiplied values are summed up to estimate an accurate processing time.

Figure 31:
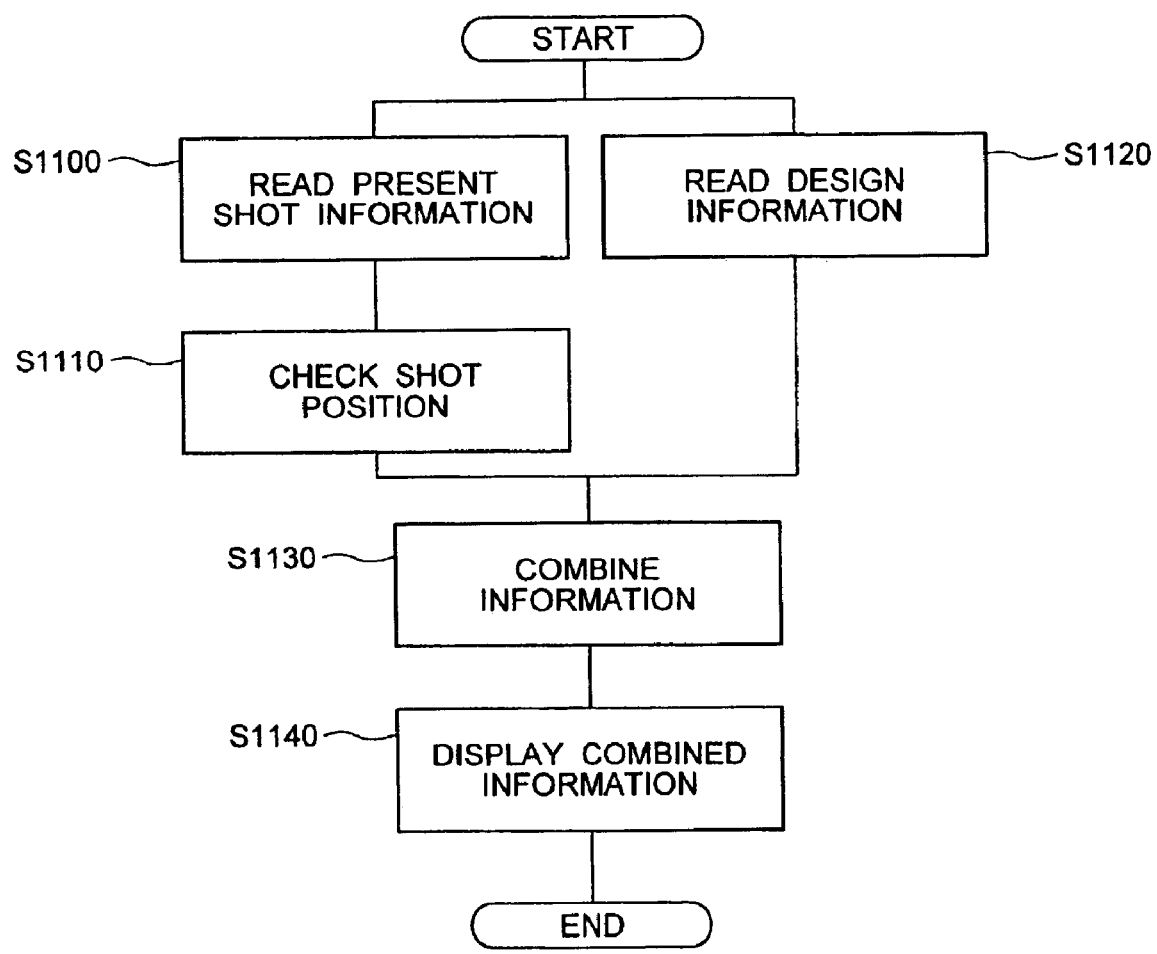
FIG. 31 is a diagram showing a sequence for displaying a present processing position of the semiconductor manufacturing apparatus.

FIG. 31 shows a sequence for displaying the present processing position of the semiconductor manufacturing apparatus. First, present shot information is read out from the storage device 30 (S1100). From the shot information read out, shot position information is retrieved (S1110). Next, design information is retrieved from the storage device 30 (S1120). Then, the design information and the shot position information are combined (S1130). The resultant total is displayed (S1140).

Figure 32:
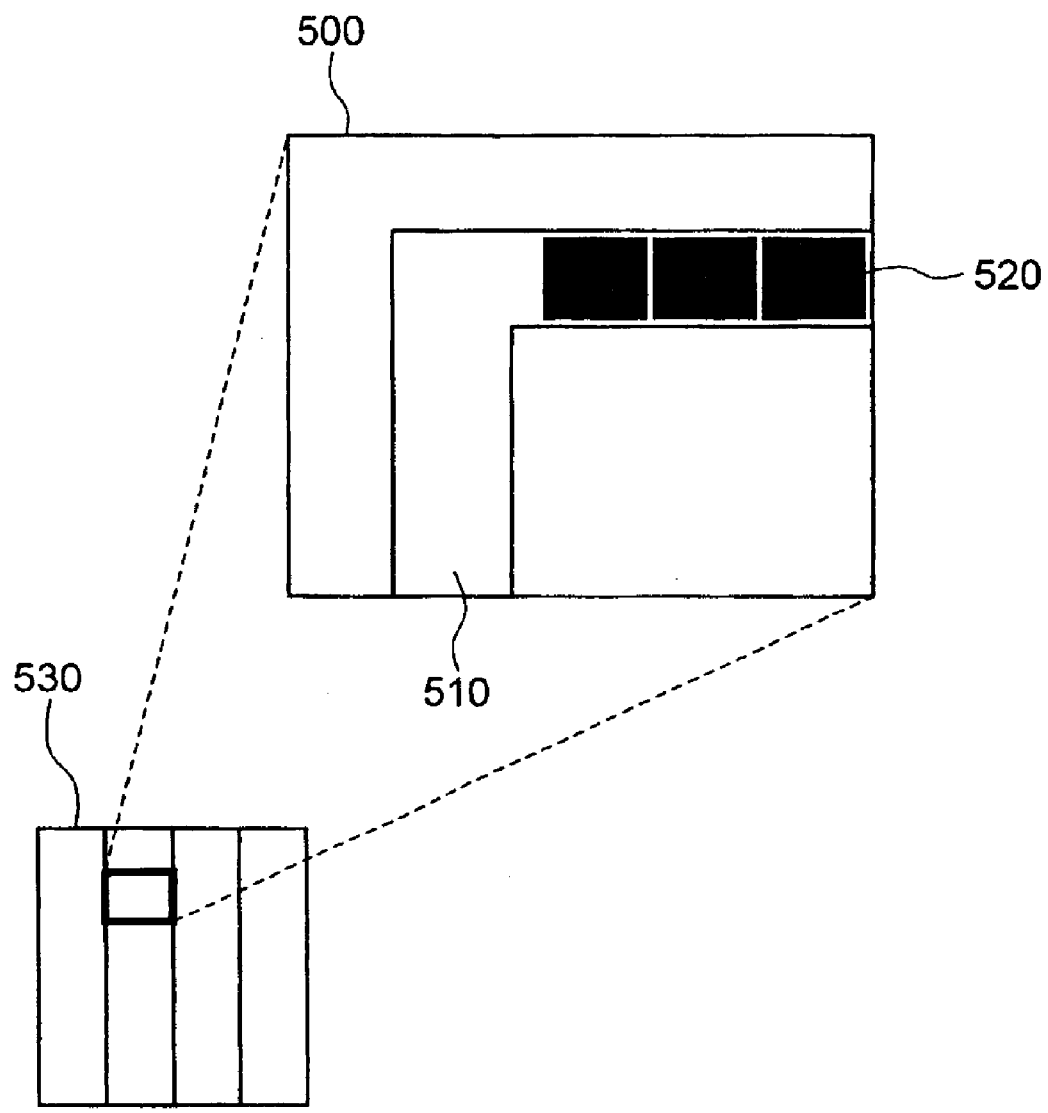
FIG. 32 is a diagram showing an example screen displaying a present processing position of the semiconductor manufacturing apparatus.

FIG. 32 shows an example screen that displays the present processing position of the semiconductor manufacturing apparatus. As shown in the figure, a display screen 500 displays a layout writing pattern 510, which is design information, and shot information 520. For the layout writing area, the shot position is a very fine area. In order to visualize the areas of shot information on the display screen 500, therefore, an area including the shot position in the area 530 displayed on the screen may be displayed magnified.

This invention discloses the following:

(1) A semiconductor production system comprising:
a semiconductor manufacturing apparatus having an exposure unit, a control unit for controlling the exposure unit and a storage device;
a semiconductor inspection apparatus having an observation unit, a control unit for controlling the observation unit and a storage device;
a storage device commonly used by the semiconductor manufacturing apparatus and the semiconductor inspection apparatus; and
a storage area network for interconnecting the semiconductor manufacturing apparatus, the semiconductor inspection apparatus and the commonly used storage device.

(2) The semiconductor production system according to item (1), wherein the storage area network has a plurality of fabrics for switching fiber channels.

(3) The semiconductor production system according to any one of items (1) to (2), wherein the commonly used storage device stores image data and design data.

(4) The semiconductor production system according to any one of items (1) to (3), wherein the semiconductor manufacturing apparatus manufactures semiconductors or masks for fabricating the semiconductors.

(5) The semiconductor production system according to any one of items (1) to (4), wherein, based on the design data, the semiconductor manufacturing apparatus generates information on an inspection position at which the semiconductor inspection apparatus performs inspection.

(6) The semiconductor production system according to any one of items (1) to (5), wherein the semiconductor manufacturing apparatus has a means for calculating accuracy of a manufacturing process by comparing the design data with shot information, the shot information representing a writing pattern generated based on the design data.

(7) The semiconductor production system according to any one of items (1) to (6), wherein the semiconductor inspection apparatus executes an inspection based on inspection position information generated by the semiconductor manufacturing apparatus or inspection position information generated by itself, and generates failure position information representing a failure position.

(8) The semiconductor production system according to item (7), wherein, based on the failure position information, the system extracts from the storage device layout information corresponding to an actual image observed by the inspection apparatus and extracts semiconductor circuit logic information based on the extracted layout information.

(9) The semiconductor production system according to any one of items (7) to (8), wherein the semiconductor inspection apparatus displays an inspection result on a screen.

(10) The semiconductor production system according to any one of items (1) to (9), wherein the storage area network has a computer to generate the inspection position to reduce a burden on the semiconductor inspection apparatus or the semiconductor manufacturing apparatus.

(11) The semiconductor production system according to item (2), wherein the plurality of fabrics are interconnected by WAN.

(12) The semiconductor production system according to any one of items (1) to (11), wherein the storage area network stores a requirement specification of a semiconductor device to be manufactured, information representing the inspection result, and link information linking these information with an ID of a storage device in which these information is stored.

(13) The semiconductor production system according to any one of items (1) to (12), wherein the storage area network has a display device for calculating and displaying a processing time or processing position of the semiconductor manufacturing apparatus.

(14) The semiconductor production system according to any one of items (1) to (13), wherein the storage area network has an estimating means for estimating a performance of a semiconductor device from the inspection result of the semiconductor inspection apparatus.

What is claimed is:

1. A semiconductor production system comprising:
a storage device storing design information;
an exposure unit;
a control unit controlling said exposure unit; and
a storage area network directly connected with said storage device and connected with said control unit.

2. A semiconductor production system according to claim 1,
wherein said control unit has a shot unit converting information read from said storage device into shot information conforming to said exposure unit.

3. A semiconductor production system according to claim 1,
wherein said control unit comprises:
a buffer memory temporarily storing said information read from said storage device;
a recovery unit processing said information;
a dividing unit dividing said information processed by said recovery unit;
a proximity effect correction unit executing a proximity effect correction between said divided information; and
a shot unit converting said information subjected to said proximity effect correction into shot information conforming to said exposure unit.

4. A semiconductor production system according to claim 1,
wherein said storage device stores requirement specification information, function specification information, logic information, cell information, layout information, mask/reticle information, and writing information.

5. A semiconductor production system comprising:
a semiconductor manufacturing apparatus having a first storage device, an exposure unit, and a control unit controlling said exposure unit;
a second storage device storing design information; and
a storage area network directly connected with said second storage device, said first storage device provided within said semiconductor manufacturing apparatus and said control unit.

6. A semiconductor production system according to claim 5,
wherein said control unit has a shot unit converting information read from said first storage device or said second storage device into shot information conforming to said exposure unit.

7. A semiconductor production system according to claim 5, wherein said control unit comprises:

a recovery unit processing information read out from said first storage device or said second storage device;

a dividing unit dividing said information processed by said recovery unit;

a proximity effect correction unit executing a proximity effect correction between said divided information; and a shot unit converting said information subjected to said proximity effect correction by said proximity correction unit, into shot information conforming to said exposure unit.

8. A semiconductor production system according to claim 5, wherein said storage stores device requirement specification information, function specification information, logic information, cell information, layout information, mask-reticle information, and writing information.

9. A semiconductor production system according to claim 5, wherein said layout information is stored in said first storage device, and said writing information processing said design information is stored in said second storage device.

* * * * *